US011923462B2

(12) United States Patent
Boles et al.

(10) Patent No.: US 11,923,462 B2
(45) Date of Patent: *Mar. 5, 2024

(54) LATERAL SCHOTTKY DIODE

(71) Applicant: MACOM Technology Solutions Holdings, Inc., Lowell, MA (US)

(72) Inventors: Timothy E. Boles, Tyngsboro, MA (US); Douglas Carlson, Lowell, MA (US); Anthony Kaleta, Lowell, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 261 days.

This patent is subject to a terminal disclaimer.

(21) Appl. No.: 17/211,116

(22) Filed: Mar. 24, 2021

(65) Prior Publication Data
US 2021/0210642 A1 Jul. 8, 2021

Related U.S. Application Data

(63) Continuation of application No. 15/223,677, filed on Jul. 29, 2016, now Pat. No. 10,985,284.
(Continued)

(51) Int. Cl.
H01L 29/872 (2006.01)
H01L 21/761 (2006.01)
(Continued)

(52) U.S. Cl.
CPC .......... H01L 29/872 (2013.01); H01L 21/761 (2013.01); H01L 29/0646 (2013.01);
(Continued)

(58) Field of Classification Search
CPC ............... H01L 29/872; H01L 29/0646; H01L 29/0649; H01L 29/2003; H01L 29/205;
(Continued)

(56) References Cited

U.S. PATENT DOCUMENTS 4,692,998 A 9/1987 Armstrong et al.
4,737,236 A 4/1988 Perko et al.
(Continued)

FOREIGN PATENT DOCUMENTS

CN 101897029 A 11/2010
CN 104064594 A 9/2014
(Continued)

OTHER PUBLICATIONS

Office Action for Chinese Application No. 201780035198.9 dated Oct. 22, 2021. (with machine translation).
(Continued)

Primary Examiner — Dale E Page
Assistant Examiner — Quovaunda Jefferson
(74) Attorney, Agent, or Firm — Perilla Knox & Hildebrandt LLP; Jason M. Perilla

(57) ABSTRACT

Various aspects of Schottky diodes are described. The diodes are capable of withstanding reverse-bias voltages of up to and in excess of 2000 V with reverse current leakage as low as 0.4 microamp/millimeter in some cases among other aspects. In one example, a Schottky diode includes a conduction layer, a first layer over the conduction layer, a second layer over the first layer, a first cathode and a second cathode spaced apart and in electrical contact with the conduction layer, and an anode over the second layer between the first cathode and the second cathode. The first cathode and the second cathode can be electrically connected to each other as a cathode of the Schottky diode.

26 Claims, 19 Drawing Sheets

Related U.S. Application Data

(60) Provisional application No. 62/323,564, filed on Apr. 15, 2016.

(51) Int. Cl.

| | | |
|---|---|---|
| *H01L 29/06* | (2006.01) | |
| *H01L 29/20* | (2006.01) | |
| *H01L 29/205* | (2006.01) | |
| *H01L 29/40* | (2006.01) | |
| *H01L 29/66* | (2006.01) | |
| *H01L 29/778* | (2006.01) | |
| *H01L 29/861* | (2006.01) | |
| *H02M 7/00* | (2006.01) | |

(52) U.S. Cl.
CPC ...... *H01L 29/0649* (2013.01); *H01L 29/2003* (2013.01); *H01L 29/205* (2013.01); *H01L 29/402* (2013.01); *H01L 29/404* (2013.01); *H01L 29/66143* (2013.01); *H01L 29/66212* (2013.01); *H01L 29/7786* (2013.01); *H01L 29/861* (2013.01); *H02M 7/003* (2013.01)

(58) Field of Classification Search
CPC ............... H01L 29/402; H01L 29/424; H01L 29/66143; H01L 29/66212; H01L 21/761; H01L 29/404; H01L 29/7786; H01L 29/861; H01L 29/47; H02M 7/003
See application file for complete search history.

(56) References Cited

U.S. PATENT DOCUMENTS

| | | | |
|---|---|---|---|
| 5,268,310 | A | 12/1993 | Goodrich et al. |
| 5,343,070 | A | 8/1994 | Goodrich et al. |
| 5,696,466 | A | 12/1997 | Li |
| 5,877,530 | A | 3/1999 | Aronowitz et al. |
| 5,976,941 | A | 11/1999 | Boles et al. |
| 6,014,064 | A | 1/2000 | Boles et al. |
| 6,114,716 | A | 9/2000 | Boles et al. |
| 6,150,197 | A | 11/2000 | Boles et al. |
| 6,197,645 | B1 | 3/2001 | Michael et al. |
| 6,329,702 | B1 | 12/2001 | Gresham et al. |
| 6,379,785 | B1 | 4/2002 | Ressler et al. |
| 6,465,289 | B1 | 10/2002 | Streit et al. |
| 6,600,199 | B2 | 7/2003 | Voldman et al. |
| 7,026,223 | B2 | 4/2006 | Goodrich et al. |
| 7,071,498 | B2 | 7/2006 | Johnson et al. |
| 7,223,441 | B2 | 5/2007 | Remington et al. |
| 7,402,842 | B2 | 7/2008 | Goodrich |
| 7,419,892 | B2 | 9/2008 | Sheppard et al. |
| 7,692,263 | B2 | 4/2010 | Wu et al. |
| 7,709,859 | B2 | 5/2010 | Smith et al. |
| 7,719,091 | B2 | 5/2010 | Brogle |
| 7,745,848 | B1 | 6/2010 | Rajagopal et al. |
| 7,755,173 | B2 | 7/2010 | Mondi et al. |
| 7,858,456 | B2 | 12/2010 | Chiola et al. |
| 7,868,428 | B2 | 1/2011 | Goodrich et al. |
| 8,237,198 | B2 | 8/2012 | Wu et al. |
| 8,912,610 | B2 | 12/2014 | Lin et al. |
| 8,946,724 | B1 | 2/2015 | Shinohara et al. |
| 9,142,659 | B2 | 9/2015 | Dora et al. |
| 9,281,417 | B1 | 3/2016 | Lin |
| 9,799,760 | B2 | 10/2017 | Green et al. |
| 9,818,856 | B2 | 11/2017 | Hoshi et al. |
| 9,837,521 | B2 | 12/2017 | Yamamoto et al. |
| 9,837,524 | B2 | 12/2017 | Miyake et al. |
| 9,853,108 | B2 | 12/2017 | Kawaguchi |
| 9,893,174 | B2 | 2/2018 | Chowdhury et al. |
| 9,911,817 | B2 | 3/2018 | Ling et al. |
| 9,935,190 | B2 | 4/2018 | Wu et al. |
| 10,541,323 | B2 | 1/2020 | Boles et al. |
| 10,622,467 | B2 | 4/2020 | Boles et al. |
| 10,985,284 | B2 * | 4/2021 | Boles ............. H01L 29/0646 |
| 2001/0032999 | A1 | 10/2001 | Yoshida |
| 2002/0139971 | A1 | 10/2002 | Eda |
| 2003/0141518 | A1 | 7/2003 | Yokogawa et al. |
| 2005/0145851 | A1 | 7/2005 | Johnson et al. |
| 2006/0086997 | A1 | 4/2006 | Kanaya et al. |
| 2007/0018199 | A1 | 1/2007 | Sheppard et al. |
| 2007/0126067 | A1 | 6/2007 | Hattendorf et al. |
| 2008/0116492 | A1 | 5/2008 | Wu et al. |
| 2008/0265379 | A1 | 10/2008 | Brandes et al. |
| 2008/0308813 | A1 | 12/2008 | Suh et al. |
| 2009/0026498 | A1 | 1/2009 | Matsuda |
| 2009/0267078 | A1 | 10/2009 | Mishra et al. |
| 2010/0019279 | A1 | 1/2010 | Chen et al. |
| 2010/0117146 | A1 | 5/2010 | Ikeda et al. |
| 2011/0049526 | A1 | 3/2011 | Chu et al. |
| 2011/0127541 | A1 | 6/2011 | Wu et al. |
| 2012/0223320 | A1 | 9/2012 | Dora |
| 2013/0015464 | A1* | 1/2013 | Hur ............. H01L 23/4824 257/E29.091 |
| 2013/0043517 | A1 | 2/2013 | Yin et al. |
| 2013/0168698 | A1 | 7/2013 | Lee et al. |
| 2014/0103357 | A1 | 4/2014 | Decoutere et al. |
| 2014/0159116 | A1 | 6/2014 | Briere et al. |
| 2014/0231823 | A1 | 8/2014 | Chowdhury et al. |
| 2014/0306235 | A1 | 10/2014 | Decoutere et al. |
| 2015/0228773 | A1 | 8/2015 | Tajiri |
| 2015/0279982 | A1 | 10/2015 | Yamamoto et al. |
| 2015/0294984 | A1 | 10/2015 | Cheng et al. |
| 2015/0303291 | A1 | 10/2015 | Makiyama et al. |
| 2016/0035719 | A1 | 2/2016 | Kanechika et al. |
| 2016/0086938 | A1 | 3/2016 | Kinzer |
| 2016/0118490 | A1 | 4/2016 | Padmanabhan et al. |
| 2016/0155674 | A1 | 6/2016 | Cho et al. |
| 2016/0190298 | A1 | 6/2016 | Wu et al. |
| 2016/0233235 | A1 | 8/2016 | Miyairi et al. |
| 2017/0133501 | A1 | 5/2017 | Etou et al. |
| 2017/0301780 | A1 | 10/2017 | Boles et al. |
| 2017/0301781 | A1 | 10/2017 | Boles et al. |
| 2017/0301798 | A1 | 10/2017 | Kaleta et al. |
| 2017/0301799 | A1 | 10/2017 | Boles et al. |
| 2017/0317202 | A1 | 11/2017 | Green et al. |
| 2017/0338171 | A1 | 11/2017 | Cho et al. |
| 2017/0345812 | A1 | 11/2017 | Chou et al. |
| 2018/0175268 | A1 | 6/2018 | Moon et al. |
| 2018/0248009 | A1 | 8/2018 | Wong et al. |
| 2018/0295683 | A1 | 10/2018 | Tung et al. |
| 2019/0229114 | A1 | 7/2019 | Boles et al. |
| 2019/0229115 | A1 | 7/2019 | Boles et al. |
| 2019/0341480 | A1 | 11/2019 | Boles et al. |
| 2020/0020681 | A1 | 1/2020 | Boles et al. |

FOREIGN PATENT DOCUMENTS

| | | |
|---|---|---|
| JP | 2008131031 A | 6/2008 |
| JP | 2008244002 A | 10/2008 |
| JP | 2009503815 A | 1/2009 |
| JP | 2009531859 A | 9/2009 |
| JP | 2010118556 A | 5/2010 |
| JP | 2013503483 A | 1/2013 |
| TW | 200830550 A | 7/2008 |
| WO | 2007018918 A2 | 2/2007 |
| WO | 2007126541 A1 | 11/2007 |
| WO | 2011031431 A2 | 3/2011 |
| WO | 2014049802 A1 | 4/2014 |
| WO | 2014050740 A1 | 4/2014 |
| WO | 2014057906 A1 | 4/2014 |
| WO | 2016014439 A3 | 1/2016 |

OTHER PUBLICATIONS

Office Action for Chinese Application No. 201780034913.7 dated Mar. 8, 2022.

Supplementary Search Report for Chinese Application No. 2017800349137 dated Feb. 28, 2022.

Tsou et al., 2.07-KV AlGaN/GaN Schottky Barrier Diodes on Silicon With High Baliga's Figure-of-Merit. IEEE Electron Device Letters. Jan. 2016;37(1):70-3.

Tangsheng et al., AlGaN/GaN MIS HEMT with AlN Dielectric. GaAs Mantech Conf Proc. 2006: 227-30.

(56) References Cited

OTHER PUBLICATIONS

International Search Report for Application No. PCT/US2017/027779 dated Nov. 29, 2017.
International Search Report for Application No. PCT/US2017/027780 dated Dec. 21, 2017.
Written Opinion for Application No. PCT/US2017/027779 dated May 8, 2018.
Written Opinion for Application No. PCT/US2017/027780 dated May 30, 2018.
Ch. II International Preliminary Report on Patentability Application No. PCT/US2017/027779 dated Aug. 9, 2018.
Ch. II International Preliminary Report on Patentability Application No. PCT/US2017/027780 dated Jul. 24, 2018.
Zhu et al; 1.9-kV AlGaN/GaN Lateral Schottky Barrier Diodes on Silicon, IEEE Electron Device Letters, IEEE Service Center, New York, NY, US, vol. 36, No. 4, Apr. 2015, pp. 375-377, XP011576492, ISSN: 0741-3106, DOI: 10.1109/LED.2015.2404309.
Hu Jie et al: "Performance Optimization of Au-Free Lateral AlGaN/GaN Schottky Barrier Diode With Gated Edge Termination on 200-mm Silicon Substrate", IEEE Transactions on Electron Devices, IEEE Service Center, Piscataway, NJ, US, vol. 63, No. 3, Mar. 2016, pp. 997-1004, XP011600261, ISSN: 0018-9383, DOI: 10.1109/TED.2016.2515566.
International Search Report and Written Opinion for PCT/US2017/027779 dated Nov. 29, 2017.
International Search Report and Written Opinion for PCT/US2017/027780 dated Dec. 21, 2017.
Tsou Schottky Chuan-Wei Barrier et al: Diodes on "2.07-kV Silicon AlGaN/GaNWith High Baliga•s Figure-of-Merit", ERS, IEEE Service IEEE vol. CENTER, 37, Electron New No. 1, York, Device NY, LETTus, Jan. 1, 2016 (Jan. 1, 2016), pp. 70-73, ISSN: XP011595111, 0741-3106, DOI: 10.1109/LED.2015.
Zhu Mingda et al: "1.9-KV AlGaN/GaN Lateral Schottky Barrier Diodes on Silicon", IEEE Electron Device Letters, IEEE Service Center, New York, NY, US, vol. 36, No. 4, Apr. 2015, pp. 375-377, XP011576492, ISSN: 0741-3106, DOI: 10.1109/LED.2015.2404309.
Office Action for Chinese Application No. 201780034913.7 dated Dec. 3, 2021. (with machine translation).

\* cited by examiner

LATERAL SCHOTTKY DIODE

CROSS REFERENCE TO RELATED APPLICATIONS

This application is a continuation of U.S. Non-Provisional application Ser. No. 15/223,677, filed Jul. 29, 2016, titled "HIGH-VOLTAGE LATERAL GAN-ON-SILICON SCHOTTKY DIODE WITH REDUCED JUNCTION LEAKAGE CURRENT," which claims priority to U.S. Provisional Application No. 62/323,564, filed Apr. 15, 2016, titled "High-Voltage Lateral GaN-on-Silicon Schottky Diode" and to U.S. Provisional Application No. 62/323,569, filed Apr. 15, 2016, titled "High-Voltage Lateral GaN-on-Silicon Schottky Diode with Reduced Junction Leakage." Each of the foregoing applications is hereby incorporated herein by reference in its entirety.

BACKGROUND

Technical Field

The technology relates to high-voltage Schottky diodes formed from gallium-nitride materials.

Discussion of the Related Art

Gallium-nitride semiconductor material has received appreciable attention in recent years because of its desirable electronic and electro-optical properties. Gallium nitride (GaN) has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, gallium nitride is more resistant to avalanche breakdown and has a higher intrinsic field strength compared to more common semiconductor materials, such as silicon and gallium arsenide. In addition, gallium nitride is a wide bandgap semiconductor and is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, and high-power applications. For example, gallium-nitride materials are useful in semiconductor amplifiers for radio-frequency (RF) communications, radar, and microwave applications.

Schottky diodes typically comprise metal-semiconductor junctions that exhibit lower threshold voltages than semiconductor-semiconductor junctions. Because of their lower threshold voltages and much smaller depletion regions, Schottky diodes can switch from conducting to non-conducting states much more quickly than semiconductor-semiconductor junction diodes. In some cases, a Schottky diode can switch several orders of magnitude faster than a semiconductor-semiconductor diode, and may operate at terahertz frequencies. Silicon-based Schottky diodes can exhibit reverse-bias breakdown voltages of up to about 100 V.

SUMMARY

Structures and methods for forming high-voltage Schottky diodes with gallium-nitride material are described. In some implementations, the diodes may be formed from one or more layers of gallium-nitride material deposited on a substrate of a different material (e.g., silicon or silicon carbide). The Schottky diodes may be arranged in a lateral, anode-cathode configuration, and may be capable of withstanding reverse bias voltages of more than 2000 volts and having low reverse bias leakage currents (e.g., between about 0.4 µA/mm of anode width and about 40 µA/mm). The high-voltage diodes may be useful for high-frequency power electronics, microwave applications including radar, and RF communications applications among other applications.

Some embodiments relate to a Schottky diode that comprises a gallium-nitride conduction layer, a barrier layer formed adjacent to the gallium-nitride conduction layer, a first cathode and a second cathode spaced apart and formed in electrical contact with the conduction layer, an anode formed adjacent to the barrier layer between the first cathode and the second cathode, and a gallium-oxide layer formed between the anode and the barrier layer. In some aspects, a thickness of the gallium-oxide layer may be between approximately 1 nm and approximately 5 nm.

In some aspects, a Schottky diode may further comprise one or more anode-connected field plates electrically connected to the anode and extending on opposite edges beyond the anode toward the first cathode and the second cathode. The one or more anode-connected field plates may comprise a first anode-connected field plate electrically connected to the anode and extending on opposite edges beyond the anode toward the first cathode and the second cathode by a first distance, and a second anode-connected field plate electrically connected to the first anode-connected field plate and extending on opposite edges beyond the first anode-connected field plate toward the first cathode and the second cathode by a second distance. The second distance may be less than the first distance.

In some implementations, a Schottky described above is capable of withstanding a reverse-bias voltage of up to 1200 volts. In some aspects, a Schottky diode is capable of withstanding a reverse-bias voltage of up to 2000 volts. The Schottky diode may exhibit a reverse-bias current between approximately 0.4 microamp/millimeter and approximately 40 microamp/millimeter at a reverse bias of 2000 volts.

According to some aspects, the anode, first cathode, second cathode, and a first anode-connected field plate may be formed of a same material. In some cases, the anode comprises a multilayer composition selected from the following group: Ni/Pd/Au/Ti, Ni/Pt/Au/Ti, Ni/Ti/Al/W, Ni/W/Al/W, W/Al/W, Ni/Wn/Al/W, WN/Al/W, and Pt/Au/Ti. In some implementations, an anode-connected field plate of the one or more anode-connected field plates comprises a multilayer composition selected from the following group: Ti/Pt/Au, Al/Cu, or TiN/Cu.

According to some implementations, a Schottky diode may further comprise a buffer layer formed on a substrate, wherein a combined thickness of the buffer layer and gallium-nitride conduction layer is at least 4.5 microns. The substrate on which a Schottky diode is formed may comprise silicon. In some implementations, the barrier layer comprises aluminum gallium nitride having a thickness between approximately 10 nm and approximately 50 nm.

According to some aspects, a Schottky diode may further comprise a gallium-nitride cap layer formed over the barrier layer. A thickness of the gallium-nitride cap layer may be between approximately 1 nm and approximately 10 nm.

In some implementations, a Schottky diode may further comprise electrical isolation regions formed adjacent to the first and the second cathodes, wherein the electrical isolation regions comprise damaged crystalline semiconductor that includes one or more of the following implanted ion species: nitrogen, phosphorous, boron, and argon.

In some aspects, a Schottky diode may further comprise an insulating layer having a thickness between approximately 100 nm and approximately 300 nm that is formed between a first extension of a first anode-connected field plate of the one or more anode-connected field plates and the barrier layer. The first extension of the first anode-connected field plate may extend beyond an outer edge of the anode by at least one micron. The one or more anode-connected field plates may include a second anode-connected field plate having a second extension that extends beyond an outer edge of the first anode-connected field plate between approximately 1 micron and approximately 3 microns. In some aspects, an outer edge of the second extension is spaced horizontally from the first or second cathode by at least 3 microns. In some implementations, a distance between an edge of the first or the second cathode and an edge of the anode is between approximately 5 microns and approximately 25 microns. In some cases, a length of the anode is between approximately 2 microns and approximately 20 microns.

According to some implementations, a Schottky diode as described above may be included in a power converter.

Some embodiments relate to a method for making a Schottky diode. The method may comprise acts of forming a gallium-nitride conduction layer on a substrate, forming a barrier layer adjacent to the gallium-nitride conduction layer, forming a first cathode and a second cathode spaced apart and in electrical contact with the conduction layer, forming an anode adjacent to the barrier layer between the first cathode and the second cathode, and forming a gallium-oxide layer between the anode and the barrier layer.

In some aspects, the act of forming the gallium-oxide layer may comprise opening a via to expose a region of a gallium-nitride layer at the location of the anode prior to forming the anode, and subjecting the exposed region to an oxygen plasma for a period of time. The period of time may be between approximately 10 seconds and approximately 120 seconds. In some implementations, the act of forming the gallium-oxide layer may comprise maintaining a pressure during the oxygen plasma between approximately 0.5 Torr and approximately 3 Torr.

According to some implementations, a method for making a Schottky diode may further comprise forming a gallium-nitride cap layer between the barrier layer and the anode, wherein the gallium-oxide layer is formed from the gallium-nitride cap layer. A method may further comprise forming one or more anode-connected field plates in electrical contact with the anode that extend beyond outer edges of the anode.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

FIG. 13-1A illustrates a multi-layer substrate on which a high-voltage Schottky diode may be formed;

FIG. 13-1B and FIG. 13-1C depict structures associated with acts for forming cathodes of a high-voltage Schottky diode, according to some embodiments;

FIG. 13-1D, FIG. 13-1E, FIG. 13-1F and FIG. 13-1G depict structures associated with acts for forming an anode and a first anode-connected field plate, according to some embodiments;

FIG. 13-1H depicts structure associated with deposition of a second insulating layer;

FIG. 13-1I, FIG. 13-1J and FIG. 13-1K depict structures associated with acts for forming a second anode-connected field plate, according to some embodiments;

FIG. 13-2A illustrates a multi-layer substrate on which a high-voltage Schottky diode may be formed;

FIG. 13-2B, FIG. 13-2C and FIG. 13-2D depict structures associated with acts for forming anode and cathode vias of a high-voltage Schottky diode, according to some embodiments; and FIG. 13-2E and FIG. 13-2F depict structures associated with acts for forming an anode, cathodes, and a first anode-connected field plate, according to some embodiments

Features and advantages of the illustrated embodiments will become more apparent from the detailed description set forth below when taken in conjunction with the drawings.

DETAILED DESCRIPTION

Microwave and radio frequency (RF) systems often include circuitry arranged to translate a frequency of a signal to a higher or lower frequency value. Frequency translation can occur in applications involving wireless transmission and receiving of signals. For example, data may be mixed onto a high-frequency carrier wave for transmission, and may later be down-converted at a receiver. Some applications may involve generation of a relatively low-frequency voltage or current that is proportional to an amplitude of a high-frequency (RF or microwave) signal. Often, Schottky diodes are used in such circuits. Some example circuits in which Schottky diodes may be used include, but are not limited to, single-ended mixers, balanced mixers, double-balanced mixers, double-double-balanced mixers, image-reject mixers, subharmonic mixers, image-recovery mixers, phase detectors, bridge-quad mixers, sampling circuits, frequency multipliers, quadrature-phase modulators, and single-sideband modulators and RF receivers.

Schottky diodes may also be used in power-conversion applications. For example, Schottky diodes may be used in various types of power converters, e.g., in power rectification and/or inversion circuitry. Schottky diodes may also be used for voltage clamping in power amplification circuits. In some cases, Schottky diodes may be used for signal sampling, pulse shaping, or fast logic gating. There are a wide variety of uses for Schottky diodes in signal processing, RF, microwave, and power electronics.

A Schottky diode may be characterized by several figures of merit. One figure of merit may be an amount of current the diode can handle when forward biased. Another figure of merit may be an amount of reverse-bias current leaked through the diode when the diode is reversed biased. Another figure of merit may be a breakdown voltage of the diode. A breakdown voltage may be a maximum amount of reverse-bias voltage that the diode can withstand before avalanche breakdown and high current conduction occurs that can destroy the diode.

The inventors have recognized and appreciated that applications relating to power amplification and RF and microwave systems may benefit from Schottky diodes having very high breakdown voltages. The inventors have conceived and developed methods and structures for forming Schottky diodes with reverse-breakdown voltages that can exceed 2000 volts. Such diodes can be used, for example, in high-frequency power electronics and resist high-voltage transients that might otherwise damage the circuits.

Figure 1A:
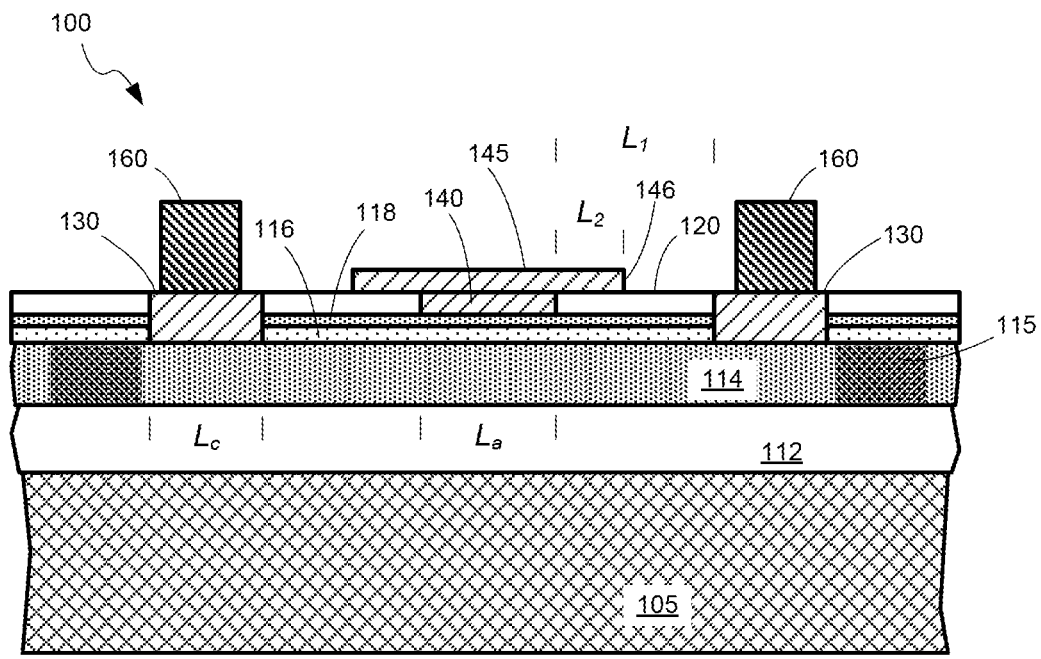
FIG. 1A depicts an elevation view of structure of a lateral, high-voltage Schottky diode comprising gallium-nitride material, according to some embodiments.

An example high-voltage Schottky diode structure is depicted in FIG. 1A, according to some embodiments. A high-voltage Schottky diode 100 may be formed as a lateral diode structure, and include one or more anodes 140 having a length $L_a$ and one or more cathodes 130 having a length $L_c$ are formed on a same side of a substrate 105. A lateral diode structure has the benefit of not needing through-substrate vias for connecting to a cathode or anode of the device. This can make integration of the high-voltage diode into an integrated circuit (IC) an easier task. A high-voltage Schottky diode 100 may comprise a multi-layer structure that includes a substrate 105, a buffer layer 112, a conduction layer 114, a barrier layer 116, and at least one electrically insulating dielectric layer 120. Some embodiments may, or may not, include a semiconductor cap layer 118, which may be formed of a same material as the conduction layer 114.

A high-voltage Schottky diode 100 may further include at least one anode-connected field plate 145, for each anode 140, and may include cathode contacts 160. Edges of the anode 140 and a nearest edge of the cathode or cathodes 130 may be separated by an anode-to-cathode distance $L_1$. Outer edges 146 of the anode-connected field plate 145 may extend beyond outer edges of the underlying anode 140 by a distance $L_2$. Electrical isolation regions 115 may be formed around one or more Schottky diodes. In some implementations, an insulating passivation layer (not shown) may be formed over the anode-connected field plate and cathode contacts.

Some implementations may include additional layers (not shown) within the multi-layer structure. For example, there may be one or more layers between the substrate 105 and conduction layer 114. These layers may include any combination of the following layers: amorphous dielectric (e.g., silicon nitride, oxide) layer(s) compositionally graded layer (s), and strain-relieving layer(s). Such layers may be included to ameliorate stresses arising from deposition of dissimilar materials and/or to improve electrical performance of the device (e.g., reduce parasitic capacitance or leakage currents).

Figure 1B:
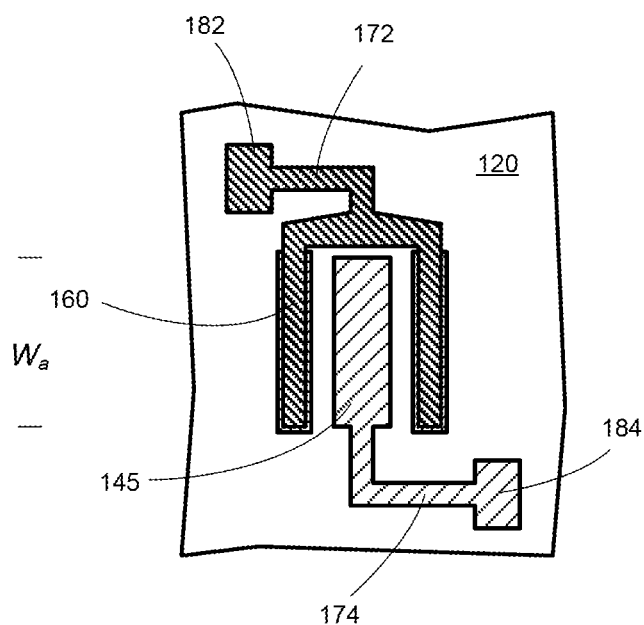
FIG. 1B depicts a plan view of a lateral, high-voltage Schottky diode comprising gallium-nitride material, according to some embodiments.
Figure 1C:
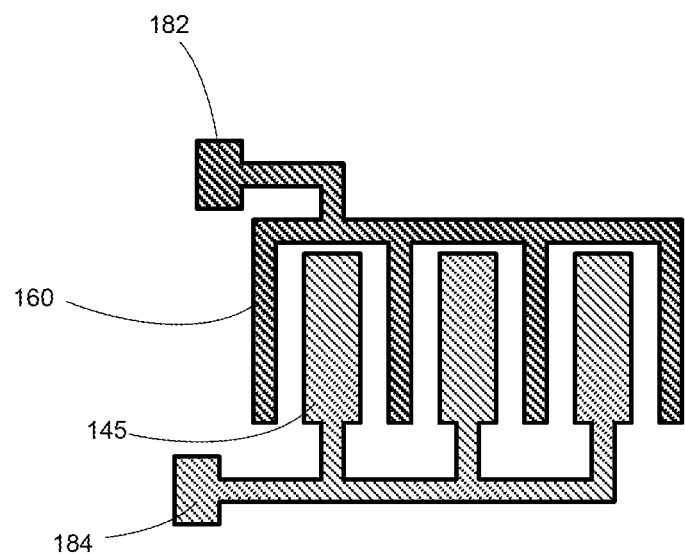
FIG. 1C depicts a plan view of multiple anode and cathode contacts for a high-voltage Schottky diode comprising gallium-nitride material, according to some embodiments.

In a plan view, a high-voltage Schottky diode 100 may be arranged as depicted in FIG. 1B or FIG. 1C. The anodes and cathodes may have extended widths in one direction and run parallel to each other, according to some embodiments. In some embodiments, a high-voltage Schottky diode may include conductive leads 174, 172 (e.g., patterned during a metallization level) that extend between one or more anode-connected field plates 145 and one or more anode contact pads 184, and between one or more cathode contacts 160 and one or more cathode contact pads 182. The contact pads may be significantly larger than depicted in the drawing, and may be significantly larger than the anode-connected field plates or cathode contacts. In some embodiments, the anode-connected field plates 145, conductive leads 174, and anode contact pads 184 may be formed from a same metallization level. In some embodiments, the cathode contacts 160, conductive leads 172, and cathode contact pads 182 may be formed from a same metallization level, which may be the same as or different from the metallization level used to form the anode-connected field plates, conductive leads 174, and anode contact pads.

In some embodiments, the anode 140, cathodes 130, and anode-connected field plate material 145 may be formed from different material compositions. For example, a cathode may comprise a multi-layer structure such as, but not limited to, Ti/Al/Ni/Au, Ti/Al/W, or Ta/Al/Ta. The anode may comprise, but is not limited to, Ni/Pd/Au/Ti, Ni/Pt/Au/Ti, Ni/Ti/Al/W, Ni/W/Al/W, W/Al/W, Ni/Wn/Al/W, WN/Al/W, or Pt/Au/Ti compositions. An anode-connected field plate may comprise, but not be limited to, Ti/Pt/Au, Al/Cu, or TiN/Cu compositions.

Figure 2:
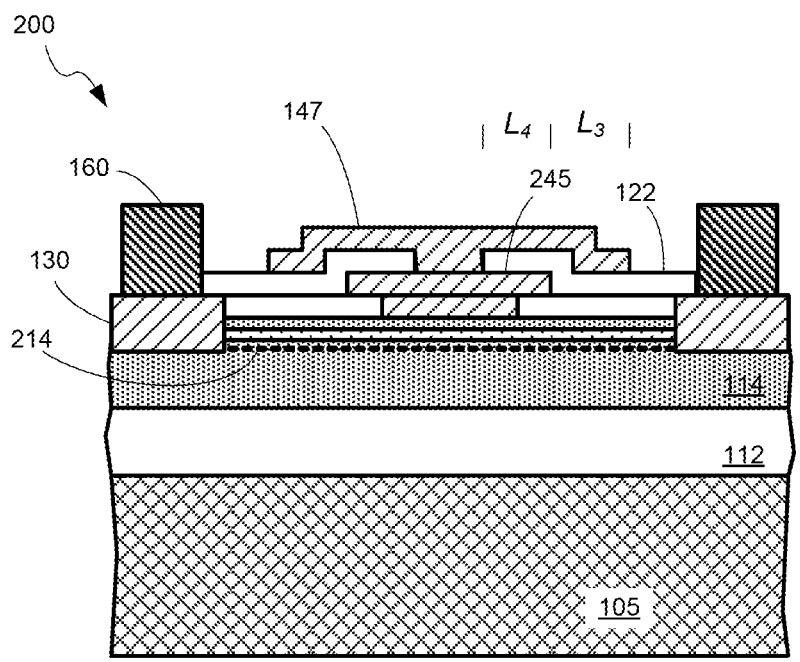
FIG. 2 depicts an elevation view of structure of a high-voltage Schottky diode having two anode-connected field plates, according to some embodiments.

FIG. 2 depicts an alternative embodiment of a high-voltage Schottky diode. Elements that are common with the embodiment depicted in FIG. 1A are identified with same reference numbers. The device depicted in FIG. 2 comprises a multi-field-plate Schottky diode 200, and includes a second anode-connected field plate 147 formed above the first anode-connected field plate 145. The second anode-connected field plate 147 is arranged to electrically contact the first anode-connected field plate at a central region of the first anode-connected field plate, and to be spaced from the first anode-connected field plate by a second insulating layer 122 over a peripheral region 245 of the first anode-connected field plate 145. The peripheral region may extend from an outer edge of the first anode-connected field plate toward its center by a distance $L_4$. The second anode-connected field plate 147 may further extend a distance $L_3$ beyond an outer edge of the first anode-connected field plate 145 toward the cathode or cathodes 130.

Dimensions for components of a high-voltage Schottky diode, for either of the embodiments depicted in FIG. 1A and FIG. 2, may be as follows. The anode lengths $L_a$ may be between approximately 2 microns and approximately 20 microns. The cathode lengths $L_c$ may be between approximately 2 microns and approximately 20 microns. The widths of the anodes $W_a$ and cathodes may be between approximately 100 microns and approximately 1000 microns, though larger and smaller widths may be used in some cases. The anodes 140 may be spaced approximately midway between cathodes 130. A shortest distance $L_1$ between anodes 140 and cathodes 130 may be between approximately 5 microns and approximately 50 microns, according to some embodiments. In some cases, $L_1$ may be between about 5 microns and about 25 microns. In yet other embodiments, $L_1$ may be between about 5 microns and about 15 microns.

In further detail, a high-voltage Schottky diode may be formed on any suitable substrate 105. Example substrates include, but are not limited to, silicon (Si), silicon carbide (SiC), gallium nitride (GaN), and sapphire. According to some embodiments, the substrate 105 may comprise bulk monocrystalline silicon. In some instances, the substrate may comprise a semiconductor on insulator (SOI) substrate where the semiconductor is any of the foregoing mentioned semiconductor substrate materials. The substrate 105 may be in the form of a wafer (e.g., a Si semiconductor wafer) and have a diameter between approximately 50 mm and approximately 450 mm. In various embodiments, the surface of the substrate is monocrystalline, so that a III-nitride (e.g., GaN, AlN, AlGaN, InGaN) or any other suitable crystalline III-V, II-VI, tertiary, or quarternary material may be epitaxially grown from the surface of the substrate.

Because there may be a lattice mismatch between the substrate 105 and the conduction layer 114, one or more transitional layers may be formed on the substrate as buffer layer 112 to ameliorate stress that would otherwise develop from the lattice mismatch. The transitional layers may be formed by epitaxial growth, according to some embodiments. For example, any of the transitional layers may be formed using a chemical vapor deposition (CVD) process or atomic layer deposition (ALD) process. A CVD process may include, but not be limited to, a metal-organic chemical vapor deposition (MOCVD) process. Other deposition processes may include hydride vapor phase epitaxy (HVPE) or molecular beam epitaxy (MBE). The transitional layers may include at least a first transitional layer (e.g., AlN) deposited directly on the substrate 105 followed by one or more gallium-nitride material layers deposited on the first transitional layer. Examples of transitional layers 112 are described in, for example, U.S. Pat. Nos. 7,135,720 and 9,064,775, which are both incorporated herein by reference in their entirety. Some of the transitional layers may be compositionally graded. A total thickness of the buffer layer may be between approximately 0.5 micron and approximately 4 microns.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_xP_yN_{(1-x-y)}$), aluminum indium gallium arsenide phosphoride nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials may be doped n-type or p-type, or may be undoped. Suitable gallium-nitride materials are described in U.S. Pat. No. 6,649,287, which is incorporated herein by reference in its entirety.

According to some embodiments, the conduction layer 114 may comprise gallium nitride (GaN) or any suitable gallium-nitride material. The conduction layer 114 may be formed by epitaxial growth (e.g., by an MOCVD process), and may be deposited directly on or above the buffer layer 112. A thickness of the conduction layer may be between approximately 0.5 micron and approximately 4 microns. In some embodiments, the conduction layer may be lightly doped (for either n or p type conductivity) or may be undoped.

The inventors have found that it is desirable to have a combined thickness of the buffer layer 112 and conduction layer 114 to be at least 4.5 microns, in some embodiments. This can avoid limiting the device's lateral breakdown by the vertical epitaxial profile. In some cases, the combined thickness of the buffer layer and conduction layer is at least 4.0 microns to avoid limiting the device's lateral breakdown by the vertical epitaxial profile.

A barrier layer 116 may be formed using any suitable epitaxial growth process, and may be deposited directly on or above the conduction layer 114, in some embodiments. A thickness of the barrier layer 116 may be between approximately 10 nanometers and approximately 50 nanometers, though other thicknesses may be used in some cases. According to some embodiments, the barrier layer 116 may comprise any suitable gallium-nitride material. The barrier layer may be doped for either n or p type conductivity, or may be undoped. The barrier layer 116 and conduction layer 114 may form a heterojunction, and thereby create a two-dimensional electron gas (2DEG) in the conduction layer 114 adjacent to the interface between the conduction layer and barrier layer. The 2DEG 214 (depicted in FIG. 2) may provide a highly conductive path for current flowing between the anode 140 and cathodes 130.

When using the terms "on," "adjacent," or "over" in to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and/or implemented in other orientations than shown in the drawing (for example, rotated about a horizontal axis by more than 90 degrees.

According to some embodiments, the conduction layer 114 comprises undoped gallium nitride (GaN), and the barrier layer comprises undoped aluminum-gallium nitride (AlGaN) having an Al percentage (by mole fraction) between approximately 20% and approximately 40%.

Some embodiments may include a semiconductor cap layer 118 formed over the barrier layer 116. The semiconductor cap layer may comprise a semiconductor material of the same type as the conduction layer 114. The cap layer 118 may or may not be doped. In some implementations, the cap layer may comprise a layer of undoped or doped GaN. The cap layer 118 may have a thickness between approximately 1 nm and approximately 10 nm. The cap layer may be formed by any suitable epitaxial deposition process (e.g., by ALD or CVD). Some implementations may not include a cap layer 118.

The conduction layer 114, barrier layer 116, and cap layer 118 may have low defect densities that are typical for integrated-circuit-grade semiconductor material. For example the defect density for each layer may be less than approximately $10^9$ $cm^{-2}$ in some implementations, and less than approximately $10^8$ $cm^{-2}$ in some embodiments. Defect densities may be higher in the buffer layer 112 or in portions of the buffer layer.

Any suitable insulating layer 120 may be used to electrically insulate one or more anode-connected field plates from the barrier layer 116 or cap layer 118. Example insulator materials include, but are not limited to silicon nitride, silicon oxide, hafnium oxide, aluminum oxide, lanthanum oxide, titanium oxide, zinc oxide, zirconium oxide, gallium oxide, scandium oxide, aluminum nitride, and hafnium nitride. An insulating layer may be formed by any suitable deposition process, such as chemical vapor deposition, plasma-enhanced chemical vapor deposition, atomic layer deposition, or electron-beam evaporation. Other deposition processes may be used in other embodiments.

Anodes 140, cathodes 130, anode-connected field plates 145, 147, and cathode contacts 160 may be formed from a metal, a metal silicide, metal alloys, a plurality of metal layers, or a highly-doped amorphous semiconductor. In some implementations, any of the anodes, cathodes, anode-connected field plates, and cathode contacts may comprise one or more layers of the following metals and/or metal alloys in any suitable combination: titanium, nickel, chromium, platinum, palladium, osmium, aluminum, gold, tungsten, rhenium, tantalum, and alloys of titanium and tungsten. In some cases, one or more of the following silicides may be used: platinum silicide, tungsten silicide, nickel silicide, cobalt silicide, titanium silicide, molybdenum silicide, and tantalum silicide. Any of the anode, cathode, and field-plate elements may be formed by a physical deposition process (e.g., electron-beam deposition or sputtering or plating). A thickness of a cathode or anode may be between approximately 20 nm and approximately 200 nm, though other thicknesses may be used in some cases. A thickness of an anode-connected field plate 145, 147 may be between approximately 200 nm and approximately 1.5 microns. A thickness of a cathode contact 160 may be between approximately 200 nm and approximately 25 microns.

Although only one or few Schottky diode structures are depicted in the drawings, many Schottky diode structures may be fabricated in parallel on a substrate 105. For example, the substrate 105 may comprise a semiconductor wafer and hundreds, thousands, or millions of the described Schottky diode structures may be fabricated on the semiconductor wafer. Some diodes may comprise multiple anodes and cathodes connected together, as depicted in FIG. 1C, so that larger currents can be handled by a diode.

In some implementations, isolation regions 115 may be formed around one or more Schottky diodes to prevent inflow or outflow of current to or from a diode to an adjacent circuit element. Isolation regions may comprise shallow trench isolation structures (e.g., trenches filled with an oxide or other insulator), in some cases, or may comprise regions of damaged crystalline semiconductor in other embodiments. The inventors have recognized and appreciated that effective isolation regions may be formed in gallium-nitride materials by damaging the crystal lattice structure with ion implantation (e.g., implanting nitrogen, argon, boron, or phosphorus). In some embodiments, an isolation region may be formed around one or more Schottky diodes by implanting a peripheral region with nitrogen at multiple different energies. The different implantation energies are used to extend the damaged region around the diode from the top of the barrier layer 116 (or cap layer if present) to a depth of at least 100 nm. Forming isolation regions 115 by ion implantation can be easier than process steps associated with forming a field oxide around the diodes.

The inventors have recognized and appreciated that structure relating to the anode-connected field plates 145, 147, insulating layers 120, 122, anode-cathode spacing $L_1$, and location of field-plate edges can critically determine a reverse-bias breakdown voltage for the described Schottky diodes. To illustrate, several numerical simulations were carried out to calculate the magnitude of electric fields in different Schottky diode structures. The structures and results from the simulations are described in connection with FIG. 3 through FIG. 12B.

Figure 3:
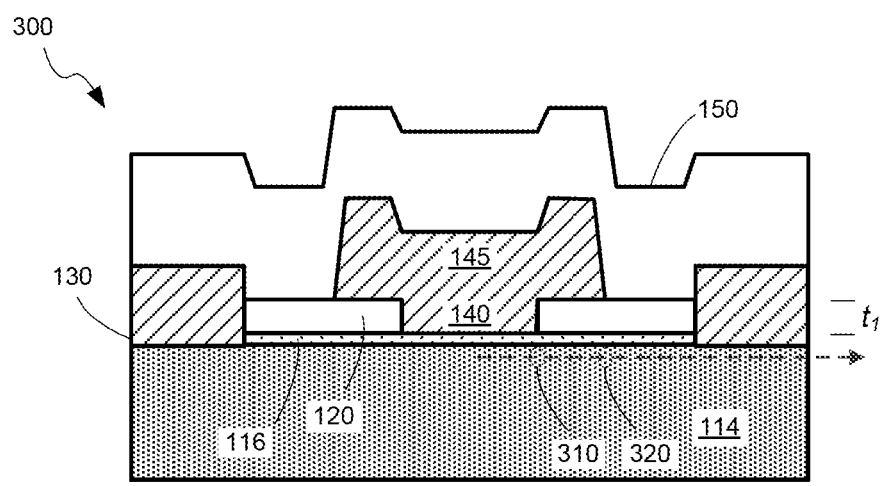
FIG. 3 depicts an elevation view of structure of a high-voltage Schottky diode having one anode-connected field plate, for which electric field simulations were carried out.

FIG. 3 depicts a Schottky diode structure 300 having a single anode-connected field plate 145 that served as a device model for a first set of numerical simulations to evaluate electric fields within the device under various bias conditions. The structure used in the simulations comprised a top portion of a Schottky diode, and included a GaN conduction layer 114, an AlGaN barrier layer 116, an anode 140, two cathodes 130, and an anode-connected field plate 145.

A first insulation layer 120 (silicon nitride) was included above the AlGaN barrier layer, and a passivation layer 150 (silicon nitride) was included over the device. For the simulations, a surface-state donor density at the interface of the AlGaN barrier layer 116 and the GaN conduction layer was $5 \times 10^{12}/cm^2$. This surface-state density was found to produce a 2DEG in the GaN conduction layer and provide diode-like current-voltage device characteristics. The length of the anode $L_a$ was 10 microns and the distance $L_1$ from the anode edge to cathode edge was 10 microns. In the simulations, the distance $L_2$ by which the field plate edge extended beyond the anode was varied.

Figure 4:
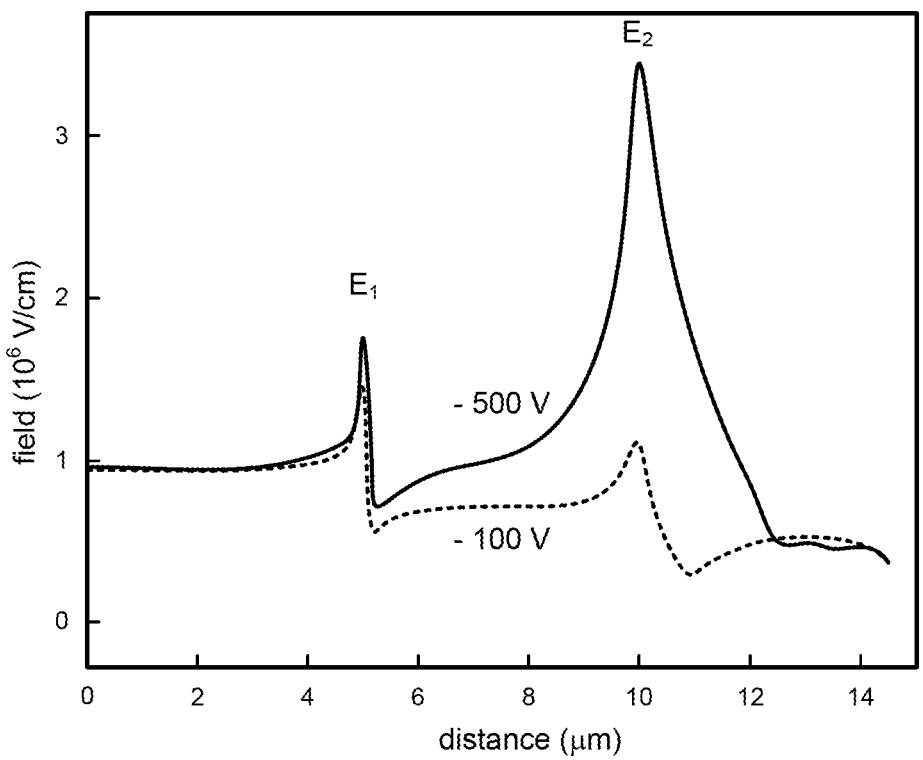
FIG. 4 illustrates calculated electric field profiles along a GaN conduction layer for the structure depicted in FIG. 3 (location and direction indicated approximately by the dashed arrow) at two reverse-bias potentials, according to some embodiments.

In a first set of simulations, the magnitude of the electric field in the gallium nitride conduction layer was calculated as a function of distance from a center of the anode toward the cathode. For these simulations, $L_2$ was approximately 5 microns. In a first case, a bias of −100 V (a reverse bias) was applied between the anode and the cathode. In a second case, a bias of −500 V was applied between the anode and the cathode. Plots of the electric field for each case are shown in FIG. 4. The plots illustrate the electric field values along the dashed arrow of FIG. 3, and are plotted for one side of the symmetric diode structure. Each plot shows a first peak in the electric field $E_1$ that appears below the edge of the anode, depicted as region 310 in the conduction layer 114. A second peak $E_2$ appears in the electric field below the edge of the anode-connected field plate 145, depicted as region 320. Other reverse bias potentials were also trialed. For these simulations, it was observed that the first peak $E_1$ tends to saturate with increasing reverse bias to a value below $2 \times 10^6$ V/cm. The second peak $E_2$ that appears below the outer edge of the field plate 145 increases in value to over $3 \times 10^6$ V/cm. Since the conduction layer comprises GaN with an intrinsic field strength of $5 \times 10^6$ V/cm, the reverse bias potential may be increased further (as much as 800 V or higher) before breakdown is observed.

The anode-connected field plate 145 spreads the electric field in the conduction layer, and helps suppress the first electric field peak $E_1$ that forms at the edge of the anode. Without the anode-connected field plate 145, the first electric field peak $E_1$ would rise to a breakdown value well before a reverse bias of 800 V.

Figure 5:
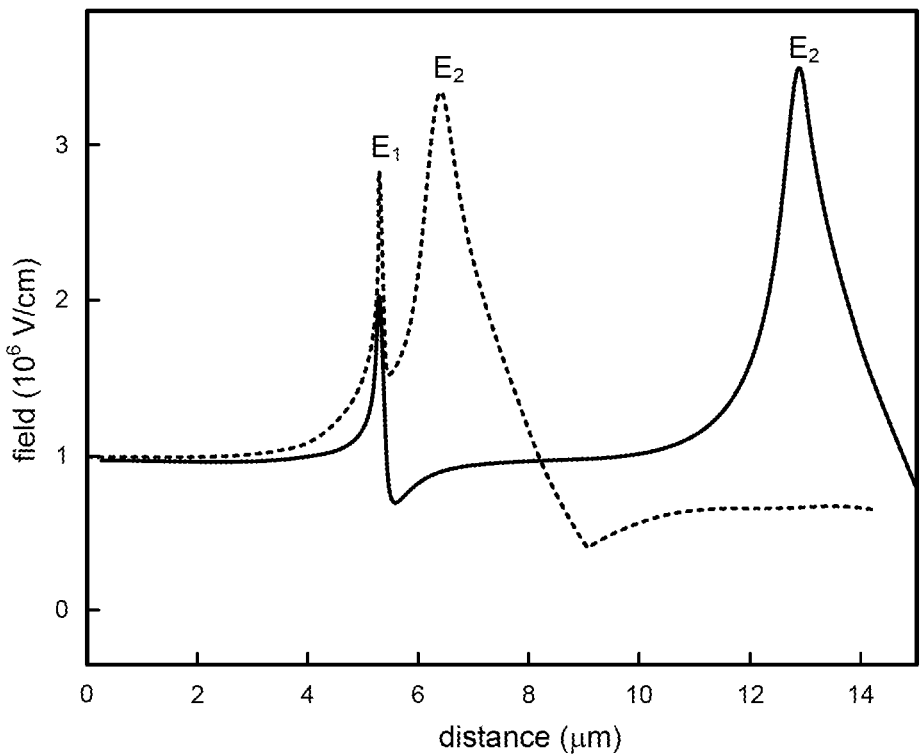
FIG. 5 illustrates calculated electric field profiles along a GaN conduction layer for the structure depicted in FIG. 3 for two field-plate lengths at a reverse-bias potential of 500 volts, according to some embodiments.

A second set of simulations were carried out to investigate different anode-connected field plate lengths. The results from these simulations are shown in FIG. 5. For these simulations, a bias of −500 V was applied between the anode and cathode. In these simulations, the extension length $L_2$ of the anode-connected field plate was changed from 1 μm to 7.5 μm. In the first simulation, shown as the dotted line, the outer edge of the anode-connected field plate was located about 1 μm beyond the outer edge of the anode. For this case, the first peak $E_1$ in the electric field was just below $3 \times 10^6$ V/cm, and the second peak $E_2$ exceeded $3 \times 10^6$ V/cm. Other extension lengths $L_2$ trialed included 2.5 μm, 5 μm, and 7.5 μm. It was found that increasing the extension length of the anode-connected field plate has little effect on the magnitude of the second electric field peak $E_2$. For example, in the fourth trial, shown as the solid line, the field-plate extension length was 7.5 μm, and although the value of the first electric field peak reduced, the second electric field peak $E_2$ remained at approximately the same value, just over $3 \times 10^6$ V/cm.

Additional simulations were carried out to observe changes in the magnitudes of the electric field peaks $E_1$ and $E_2$ due to varying the thickness $t_1$ of the insulating layer 120. Additionally, field-plate extension lengths $L_2$ were also varied in the simulations. For these simulations, the length of the anode was 10 μm, and a distance from the anode to the cathode was also 10 μm. Also a bias of −500 V was applied between the anode and cathode. The insulating layer 120 comprised silicon nitride. The observed changes in electric field peaks are plotted in FIG. 6A and FIG. 6B.

Figure 6A:
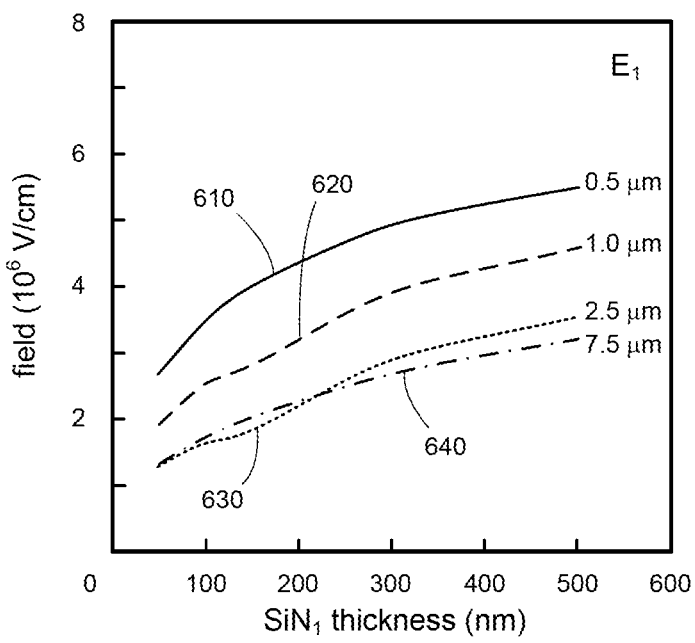
FIG. 6A illustrates the value of the first electric field peak $E_1$ near the anode edge in the GaN conduction layer as a function of silicon nitride thickness for four different field-plate lengths.

In FIG. 6A the value of the first electric field peak $E_1$ is plotted as a function of insulating layer thickness $t_1$ for four different field-plate extension lengths $L_2$. A first trace 610 was observed for a field-plate extension length of 0.5 μm. A second trace 620 corresponds to a field-plate extension length of 1 μm. The third trace 630 and forth trace 640 correspond to field-plate extension lengths of 2.5 μm and 7.5 μm respectively. As can be observed, the magnitude of the first electric field peak $E_1$ decreases with decreasing thickness in the insulating layer 120. Additionally, the magnitude of the first electric field peak $E_1$ decreases with increasing length of the field-plate extension length $L_2$.

Figure 6B:
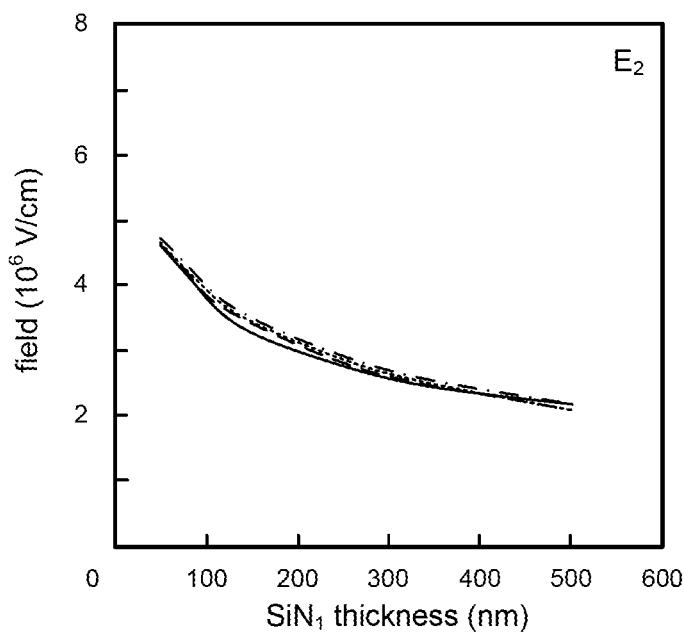
FIG. 6B illustrates the value of the second electric field peak $E_2$ below the anode-connected field-plate edge in the GaN conduction layer as a function of silicon nitride thickness for four different field-plate lengths.

FIG. 6B illustrates plots of the second electric field peak $E_2$ as a function of insulating layer thickness $t_1$ for the same field-plate extension lengths that were trialed for the graph of FIG. 6A. In terms of the second peak $E_2$, the extension length $L_2$ of the field plate has little effect on the value of the second electric field peak. This result is consistent with the results shown in FIG. 5. Additionally, the value of the second electric field peak $E_2$ decreases with increasing thickness $t_1$ of the insulating layer 120. This is an opposite trend from that observed in FIG. 6A. These results suggest that an insulating layer thickness for a single field-plate design is preferably in a range between about 100 nm and about 300 nm. The results also indicate that is beneficial to have the first anode-connected field plate 145 extend beyond the outer anode edge by at least one micron.

Figure 7:
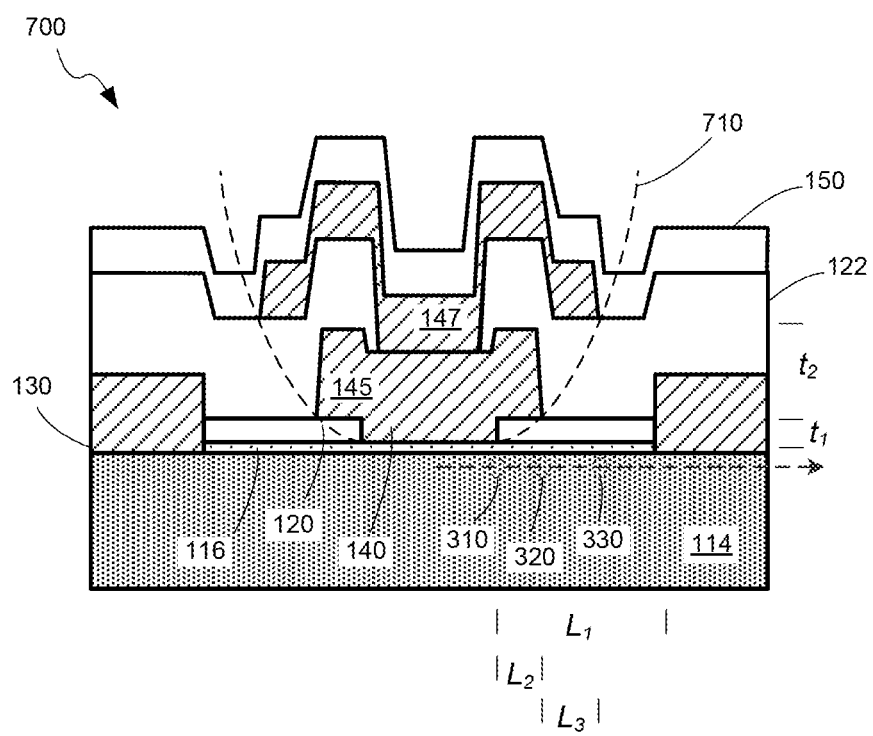
FIG. 7 depicts an elevation view of structure of a high-voltage Schottky diode having two anode-connected field plates, for which electric field simulations were carried out.

A second set of simulations were carried out to calculate the electric field values in the gallium-nitride conduction layer for a two field-plate design depicted in FIG. 7. The structure 700 included a second anode-connected field plate 147 electrically connected to a first anode-connected field plate 145. The second anode-connected field plate extended farther toward the cathode than the first anode-connected field plate by a distance $L_3$. The second anode-connected field plate may be formed above and in electrical contact with the first anode-connected field plate. For this design, a second insulating layer 122 overlies the first anode-connected field plate and cathodes, and portions of the second anode-connected field plate are located above the second insulating layer 122. A passivation layer 150 was included over the device, and the surface-state density was $5 \times 10^{12}/\text{cm}^2$. The length of the anode was 10 µm, and the distance from the anode edge to the cathode edge was also 10 µm. For the simulations, a thickness of the first insulating layer 120 was fixed at 50 nm. The extension length $L_2$ of the first field plate 145 was fixed at 2.5 µm.

Figure 8:
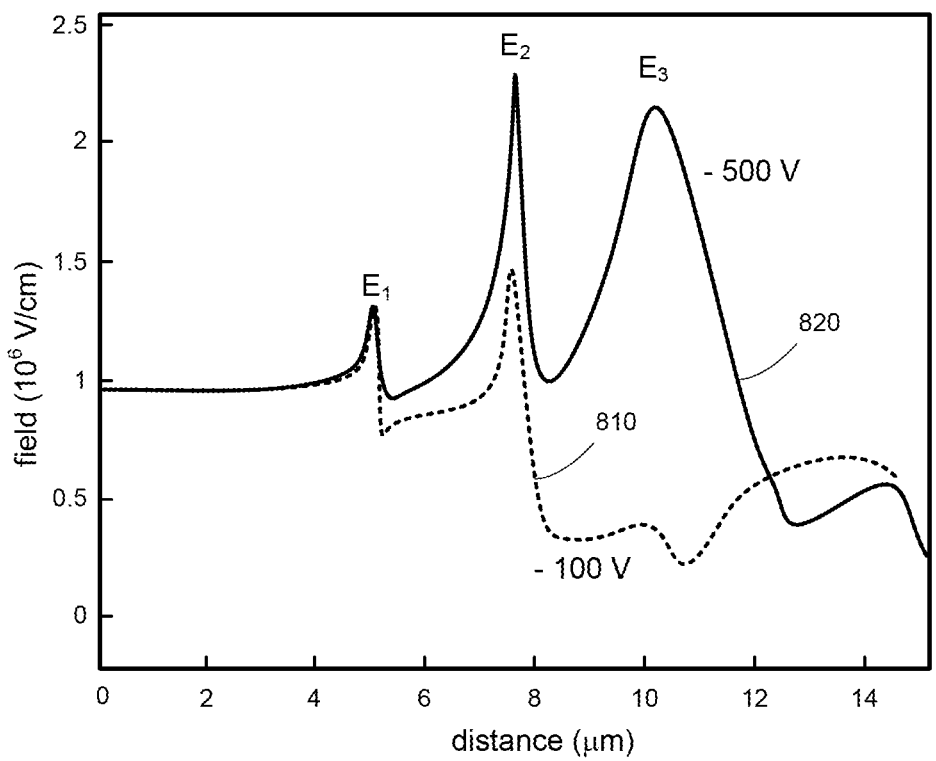
FIG. 8 illustrates calculated electric field profiles along a GaN conduction layer for the structure depicted in FIG. 7 (location and direction indicated approximately by the dashed arrow) at two reverse-bias potentials, according to some embodiments.

Electric field values along the gallium-nitride conduction layer were calculated for different reverse bias potentials, of which two are shown in FIG. 8. The extension length $L_3$ of the second field plate was fixed at 2.5 µm for the results shown in FIG. 8. In a first trial the applied bias was −100 V, and the value of the electric field along the gallium-nitride conduction layer 114 is shown as the dashed line 810. In a second trial, the applied bias was −500 V and is shown as the solid trace 820. In each case, three peaks in the electric field were observed in the gallium-nitride conduction layer between the anode center and the cathode edge. The first peak $E_1$ corresponds to an outer edge of the anode, located at approximately 5 µm in the simulated structure 700. The second peak $E_2$ appears below the outer edge of the first anode-connected field plate 145. A third peak $E_3$ appears below the outer edge of the second anode-connected field plate 147, depicted as region 330 in the conduction layer 114. Similar to the single field-plate design, the value of the first electric field peak $E_1$ saturates with increasing reverse bias potential. For this simulated structure, the value of the first electric field peak $E_1$ reaches about $1.4 \times 10^6$ V/cm. The values of the second and third electric field peaks, however, increase with increasing reverse bias voltage. For the simulated structure, the values of the second and third electric field peaks reach about $2.2 \times 10^6$ V/cm at a reverse bias of about 500 V. Adding a second anode-connected field plate 147 reduces the value of the peak electric fields beyond the edge of the anode, as can be seen by comparing the plots of FIG. 8 with those of FIG. 4.

In additional simulations, the extension length $L_3$ of the second field plate was varied between the following values: 0.5, 1.0, 2.5, and 5.0 µm. Results from these simulations were similar to those shown in FIG. 5, but with an additional electric field peak $E_3$.

Figure 9A:
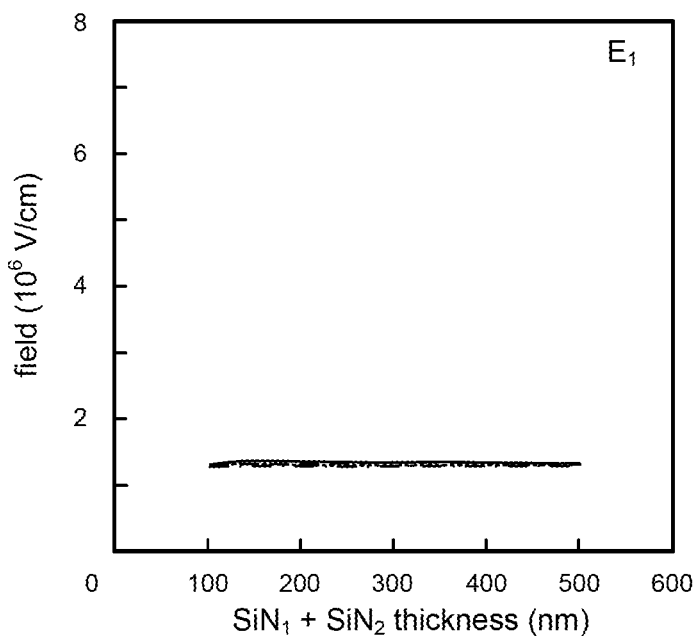
FIG. 9A illustrates the value of the first electric field peak $E_1$ near the anode edge in the GaN conduction layer for the structure depicted in FIG. 7 as a function of silicon nitride thickness for four different field-plate lengths.
Figure 9B:
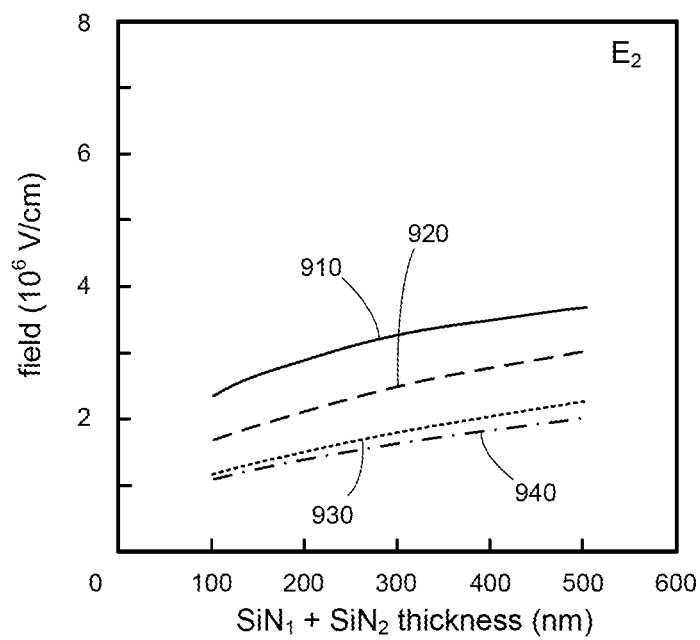
FIG. 9B illustrates the value of the second electric field peak $E_2$ below the first field-plate edge in the GaN conduction layer for the structure depicted in FIG. 7 as a function of silicon nitride thickness for four different field-plate lengths.
Figure 9C:
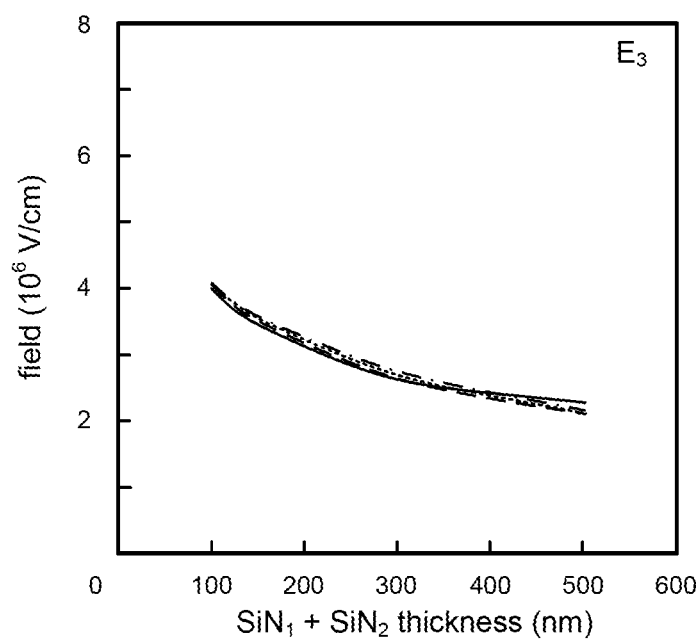
FIG. 9C illustrates the value of the third electric field peak $E_3$ below the second field-plate edge in the GaN conduction layer for the structure depicted in FIG. 7 as a function of silicon nitride thickness for four different field-plate lengths.

Simulations were also carried out to observe changes in the peak electric fields $E_1$, $E_2$, and $E_3$ caused by changing the thickness $t_2$ of the second insulating layer 122. The results from these simulations are shown in FIG. 9A through FIG. 9C. In FIG. 9A the value of the first electric field peak $E_1$ is plotted as a function of total insulator thickness. The total insulator thickness comprises the fixed thickness of the first insulating layer 120 ($t_1 = 50$ nm) and the thickness $t_2$ of the second insulating layer 122, which was varied for each case. Four field-plate extension lengths $L_3$ for the second anode-connected field plate 147 were trialed. As can be seen from the plots of FIG. 9A, changes in thickness $t_2$ of the second insulating layer 122 and changes in extension length $L_3$ of the second anode-connected field plate have little effect on the magnitude of the first electric field peak $E_1$.

FIG. 9B, however, shows that changes in insulator thickness $t_2$ and changes in extension length $L_3$ change the value of the second electric field peak $E_2$. For the simulated structure 700, increasing the field-plate extension length decreases the value of the second electric field peak, as does decreasing the thickness of the second insulating layer 122. The first trace 910 corresponds to a field-plate extension length $L_3$ of 0.5 µm. The second trace 920 corresponds to a field-plate extension length of 1 µm. The third trace 930 and fourth trace 940 correspond to a field-plate extension length of 2.5 µm and 5 µm, respectively.

The value of the third electric field peak $E_3$ is plotted in FIG. 9C as a function of the total insulator thickness $(t_1+t_2)$ for the same for field-plate extension lengths used in FIG. 9A and FIG. 9B. As can be seen, increasing the field-plate extension length has little effect on the value of the third electric field peak $E_3$. However, increasing the thickness $t_2$ of the second insulating layer decreases the value of the third electric field peak, which is an opposite trend from that observed in FIG. 9B. Because the value of the second electric field peak $E_2$ remains below a breakdown field strength for gallium nitride at larger thicknesses of the second insulating layer 122, it may be preferable to use a thicker insulating layer for the second insulating layer to keep the second and third electric field peak values in the gallium-nitride conduction layer below a breakdown field strength. For example, the second insulating layer 122 may have a thickness $t_2$ between approximately 400 nm and approximately 600 nm, according to some embodiments.

Based upon the simulation results, a number of high-voltage Schottky diodes were fabricated according to structure shown in FIG. 7. The diodes included two anode-connected field plates formed above and anode. An extension length $L_2$ of the first anode-connected field plate was 2.5 µm. The distance $L_1$ from the anode edge to the cathode edge for a first group of diodes was approximately 10 µm, and for a second group of diodes was approximately 15 µm. Reverse bias potentials were applied to the devices until the devices exhibited breakdown. An extension length of the second anode-connected field plate 147 was varied across diodes within each group.

Figure 10:
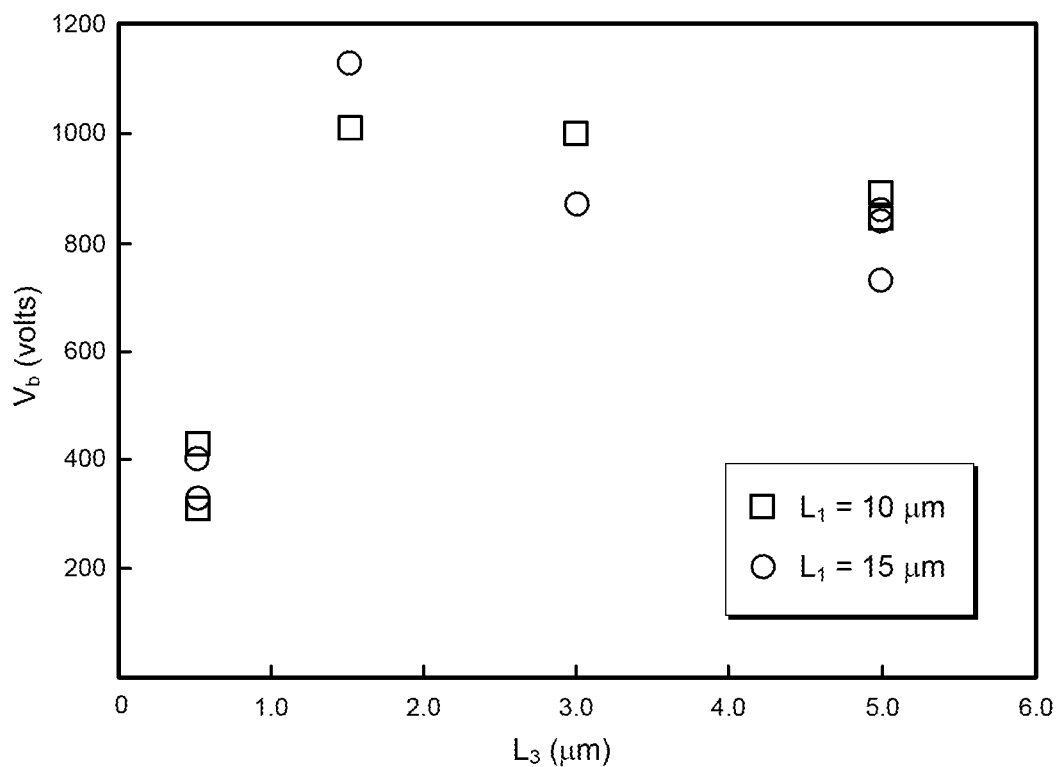
FIG. 10 illustrates the effect of varying the distance between the first and second field-plate edges on breakdown voltage for two anode-to-cathode separations.

Results from the breakdown tests are plotted in FIG. 10. The breakdown voltage $V_b$ observed for the tested devices is plotted as a function of the extension length $L_3$ of the second anode-connected field plate 147. The results show that a significant improvement in breakdown voltage is achieved when the extension length $L_3$ is increased from about 0.5 µm to about 1.5 µm. At about 1.5 µm, breakdown voltages of more than 1000 V and as much as 1200 V reverse bias were observed for some diodes. Increasing the extension length $L_3$ further resulted in a reduction of reverse bias breakdown voltage. For highest breakdown voltages for the tested structure (e.g., in excess of 900 volts reverse bias), there exists a critical range of field-plate extension lengths $L_3$ for the second anode-connected field plate. In this case, the range is between approximately 1.25 µm and approximately 2.5 µm. The range of lengths may be increased for lower breakdown voltages. For example, in some cases $L_3$ may be between approximately 1 µm and approximately 3 µm, or in some instances between approximately 1 µm and approximately 4 µm for breakdown voltages between about 700 V and about 1200 V reverse bias.

In some implementations, it may be beneficial to have the extension length $L_3$ of the second anode-connected field plate 147 less than an extension length $L_2$ of the first anode-connected field plate 145. According to some embodiments, the outer edge of the anode, first anode-connected field plate 145, and second anode-connected field plate 147 may lie along a curve 710 (referring to FIG. 7) that bends away from the surface of the substrate, e.g., bends away from the barrier layer 116.

Some minor differences were observed between the two different anode-to-cathode distances $L_1$. A highest breakdown voltage is observed for the larger anode-to-cathode spacing (15 µm) when the extension length $L_3$ of the second anode-connected field plate is within the critical range. However, higher breakdown voltages were observed for the smaller anode-to-cathode spacing at other extension length values.

Figure 11:
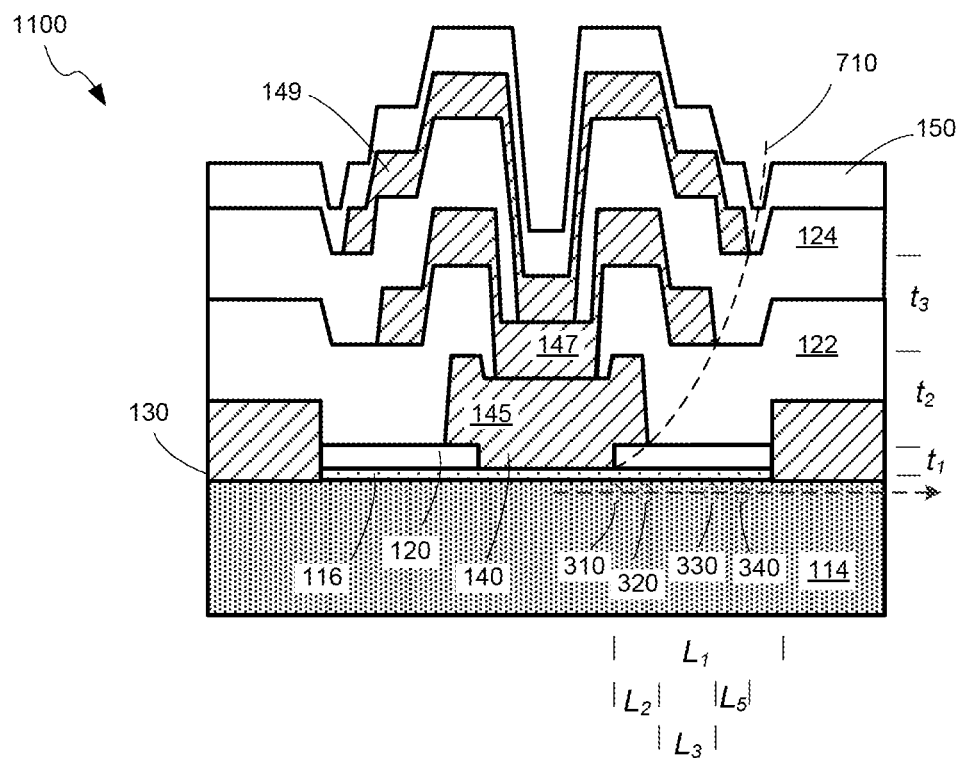
FIG. 11 depicts an elevation view of structure of a high-voltage Schottky diode having three anode-connected field plates, for which electric field simulations were carried out.
Figure 12A:
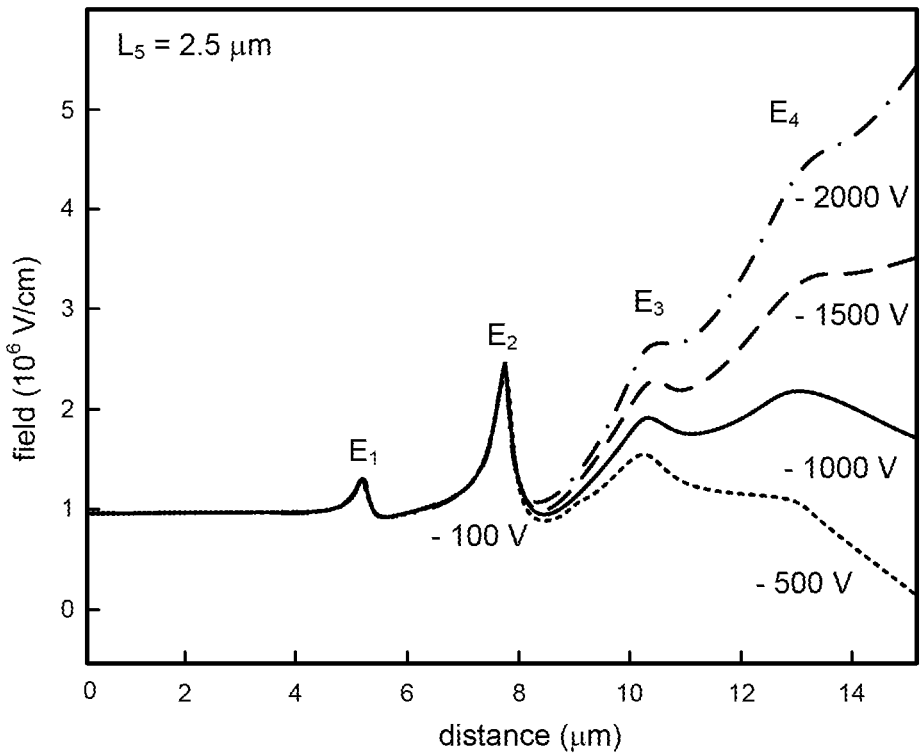
FIG. 12A illustrates calculated electric field profiles along a GaN conduction layer for the structure depicted in FIG. 11 (location and direction indicated by the dashed arrow) at four reverse-bias potentials where the third anode-connected field plate extends approximately 2.5 microns beyond the second anode-connected field plate.
Figure 12B:
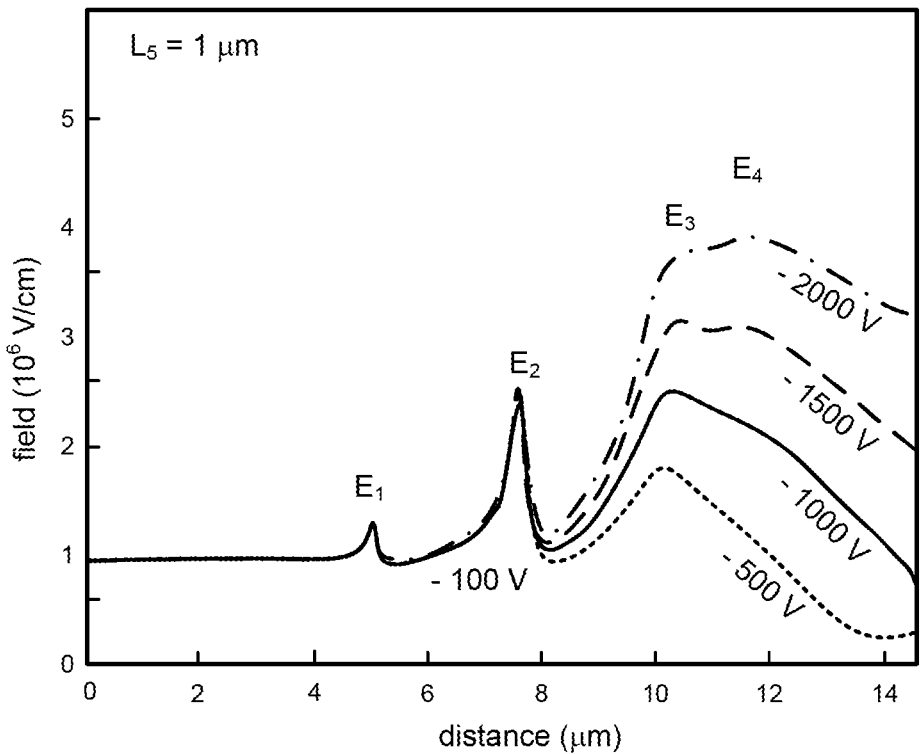
FIG. 12B illustrates calculated electric field profiles along a GaN conduction layer for the structure depicted in FIG. 11 at four reverse-bias potentials where the third anode-connected field plate extends approximately 1 micron beyond the second anode-connected field plate.

High-voltage Schottky diodes having three anode-connected field plates have also been contemplated by the inventors. An example high-voltage diode structure 1100 is depicted in FIG. 11. Numerical simulations were also carried out for this structure to evaluate the electric field in the gallium-nitride conduction layer 114. For these simulations, the anode length $L_a$ was 10 µm, and the anode-to-cathode spacing $L_1$ was 10 µm. The extension length $L_2$ of the first anode-connected field plate 145 was 2.5 µm, and the extension length $L_3$ of the second anode-connected field plate 147 was 2.5 µm. The thickness $t_1$ of the first insulating layer 120 was 50 nm, and the thickness $t_2$ of the second insulating layer 122 was 450 nm. The thickness $t_3$ of the third insulating layer 124 was set at 500 nm for the simulations. In a first set of simulations, electric field values along the gallium-nitride conduction layer were calculated for a third field-plate extension length $L_5$ of 2.5 µm, and are plotted in FIG. 12A for four different reverse bias potentials. The values of the peak electric fields $E_1$, $E_2$, $E_3$, and $E_4$ in the corresponding regions 310, 320, 330, and 340 of the conduction layer 114 can be observed from the plots. For this structure, the outer edge of the third anode-connected field plate 149 is close to the cathode, and at high reverse bias the electric field increases significantly near the cathode.

In a second set of simulations, the electric fields in the conduction layer were calculated for a third extension length $L_5$ of 1 µm. By allowing more spacing between an outer edge of the third anode-connected field plate 149 and the inner edge of the cathode, the electric field near the cathode reduces. This can be seen from the curves of FIG. 12B. The electric field values shown in FIG. 12B indicate that it is possible to keep the electric field in the gallium-nitride conduction layer well below its intrinsic breakdown value of $5 \times 10^6$ V/cm at an applied potential of −1500 V. This indicates that the device may be capable of withstanding reverse bias voltages as much as 2000 V. Reverse bias voltages up to 1500 V may be applied for long periods of time (e.g., longer than one second), since the electric field is well below the intrinsic field strength. In some embodiments, an outer edge of any of the anode-connected field plates should be spaced horizontally from the cathode by at least 3 microns.

Simulations were also carried out to observe the effect of increasing a distance between the anode and cathode for the diode. In the simulation, the distance $L_1$ was increased by 50% to a value of 15 µm. However, this increase in anode-to-cathode distance had little effect on the peak values of the electric fields $E_1$, $E_2$, $E_3$, and $E_4$. The largest effect of increasing the anode-to-cathode spacing appeared as a reduction in the electric field value near the cathode to a value less than $1 \times 10^6$ V/cm at the four reverse bias potentials.

According to some embodiments, microfabrication techniques for forming anode-connected field plates may be performed without planarization of the substrate after depositions of the anode and first anode connected field plate, insulating layers, and subsequent anode-connected field plates. Avoiding planarization steps can reduce the time and cost of device fabrication. In some cases, planarization steps (e.g., chemical-mechanical polishing) may be used after some or all depositions of the anode-connected field plates and insulating layers.

Figures 1A, 13:
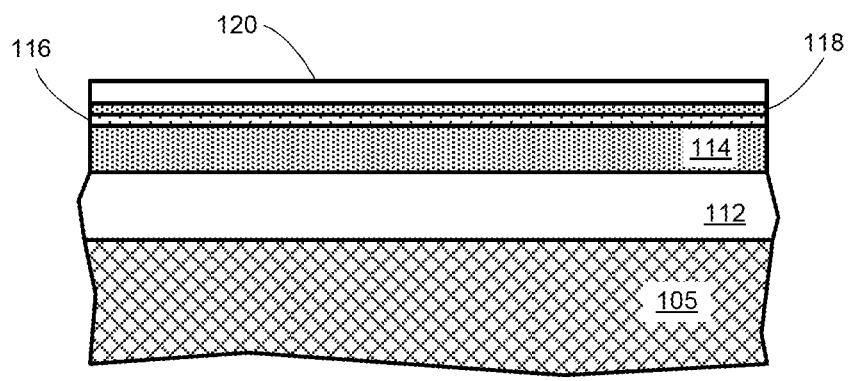
Figures 1B, 13:
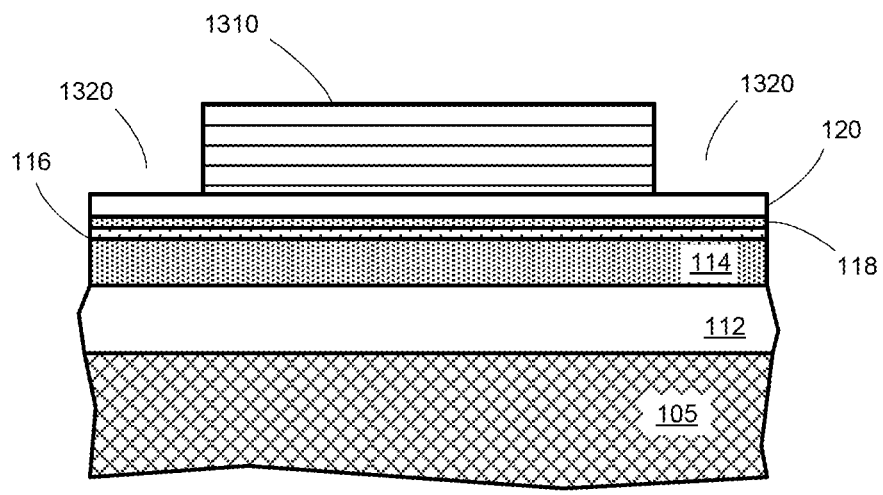
Figures 1C, 13:
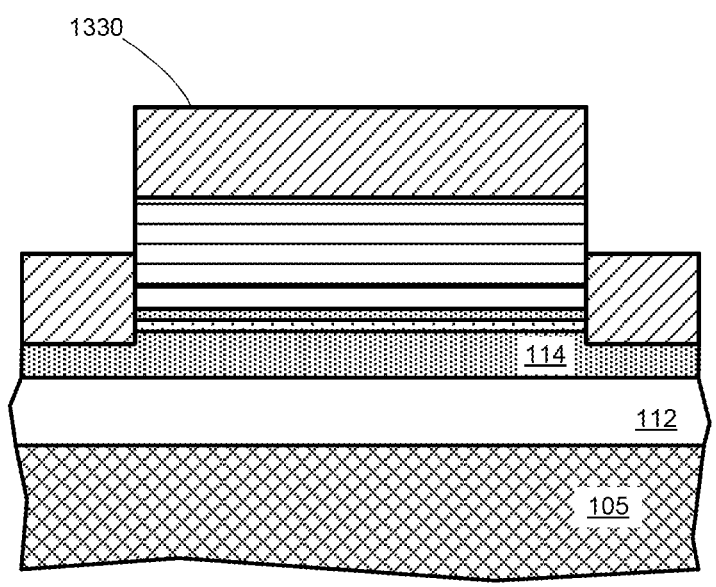

Example fabrication techniques of the high-voltage Schottky diode will now be described. Referring to FIG. 13-1A, a wafer may be prepared or obtained that includes a multi-layer stack for a high-voltage Schottky diode. For example, the wafer may comprise substrate 105, a buffer layer 112, a gallium-nitride conduction layer 114, a barrier layer 116, and a cap layer 118. The buffer layer 112, gallium-nitride conduction layer 114, barrier layer 116, and cap layer 118 may be epitaxially grown on the substrate or deposited by any suitable process. According to some implementations, an insulating layer 120 (for example, a silicon nitride layer) may be deposited over the multi-layer stack using any suitable deposition process.

Figures 1D, 13:
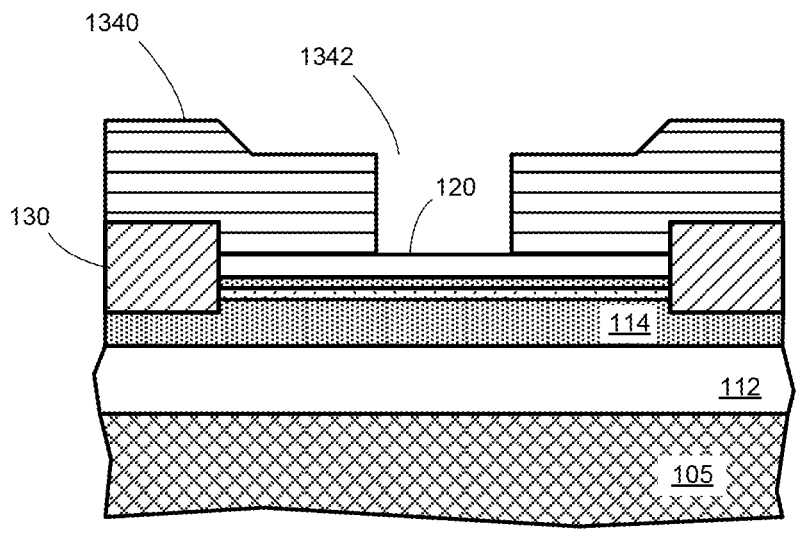

A photoresist 1310 may be patterned over the insulating layer 120, as depicted in FIG. 13-1B. The photoresist may be patterned to open cathode vias 1320 by any suitable photolithography method, such as projection photolithography. Subsequently the insulating layer 120, cap layer 118, barrier layer 116, and possibly a portion of the conduction layer 114 may be etched anisotropically (e.g., using reactive ion etching) to expose the conduction layer. In some embodiments, the etch may stop at or part way into the barrier layer. In some implementations, the etch may continue into the conduction layer 114, as depicted. A conductor 1330 (e.g., any suitable cathode composition described above) may be deposited over the substrate, as depicted in FIG. 13-1C. The first resist layer 1310 and excess conductor 1330 over the resist may be removed from the substrate in a lift-off process. The lift-off will leave cathodes 130 on the substrate, as depicted in FIG. 13-1D.

Figures 1E, 13:
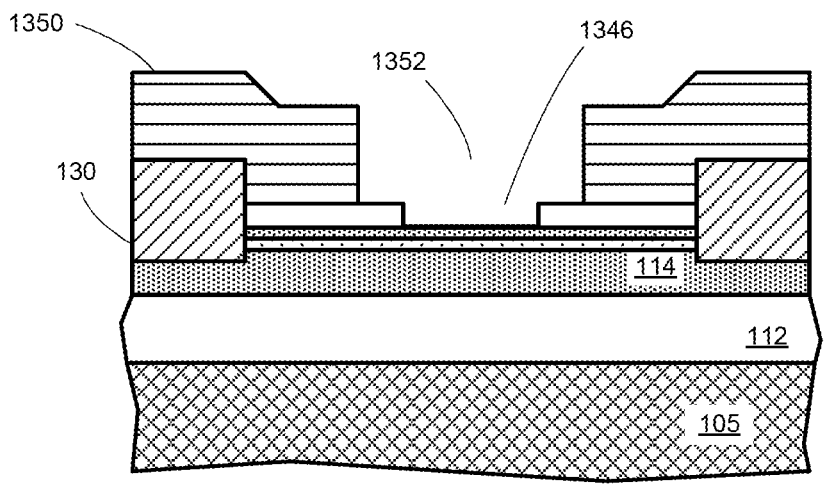

A second layer of resist 1340 may be deposited and patterned to open a via 1342 for patterning the anode. The insulating layer 120 may then be etched anisotropically to form an anode via 1346 and expose the cap layer 118 (or barrier layer 116 if the cap layer is not used). The second layer of resist 1340 may be stripped from the wafer, and a third layer of resist 1350 deposited, as depicted in FIG. 13-1E. A via 1352 for forming an anode and anode-connected field plate may be patterned in the third layer of resist 1350. The via 1352 is larger than the anode via 1346 in the insulator 120.

Figures 1F, 13:
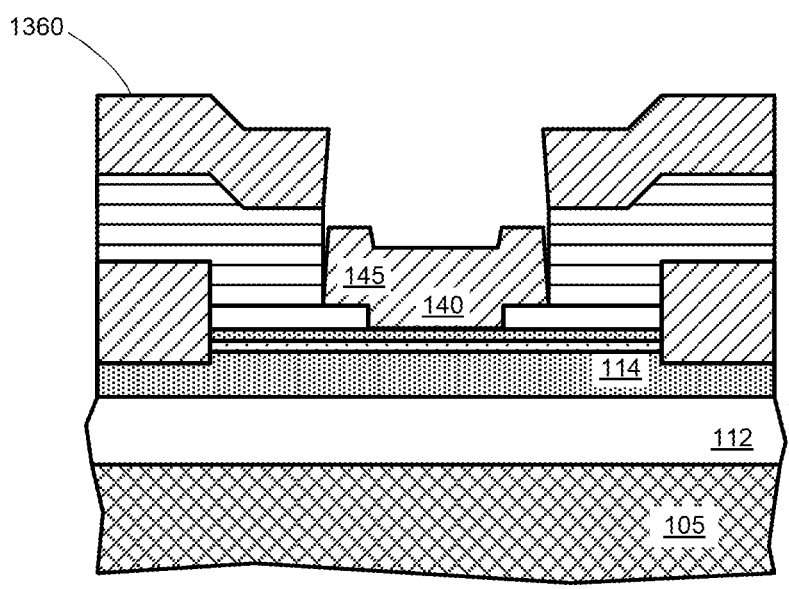
Figures 1G, 13:
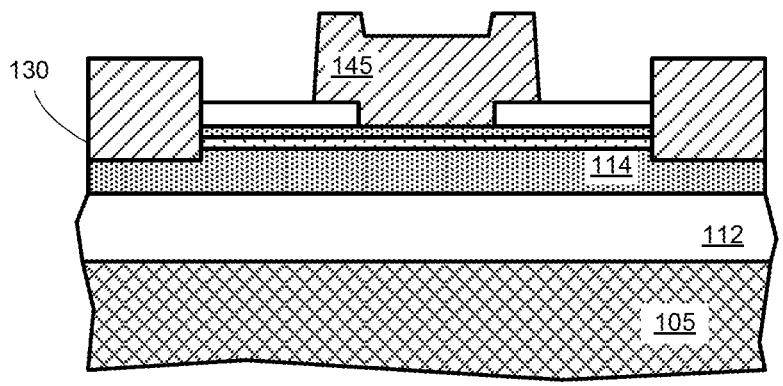

A lift-off process may then be carried out to deposit the anode 140 and a first anode-connected field plate 145. An anode deposition may then be performed, as illustrated in FIG. 13-1F, which deposits any suitable anode conductor 1360 having a composition as described above. According to some embodiments, the deposition also forms a first anode-connected field plate 145 that extends beyond the anode 140 over the insulating layer 120. The third layer of resist 1350 and excess anode conductor 1360 may be removed from the substrate using the lift-off process. A resulting Schottky diode structure having a single anode-connected field plate is depicted in FIG. 13-1G.

Figures 1H, 13:
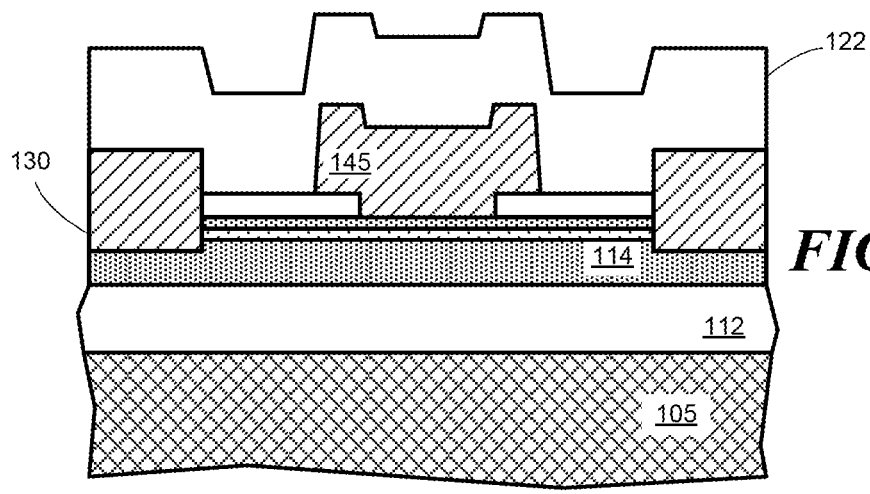
Figures 1I, 13:
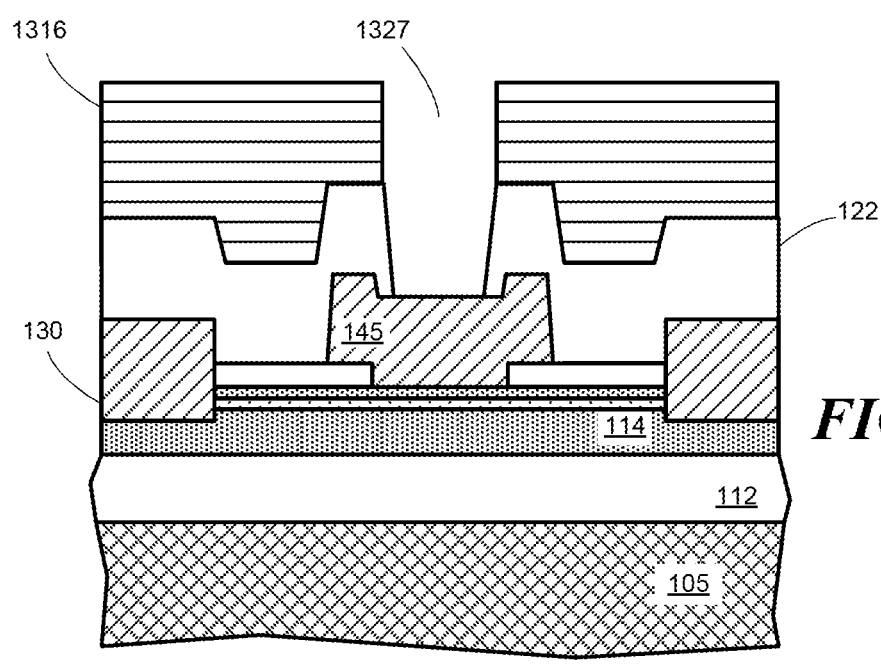
Figures 1J, 13:
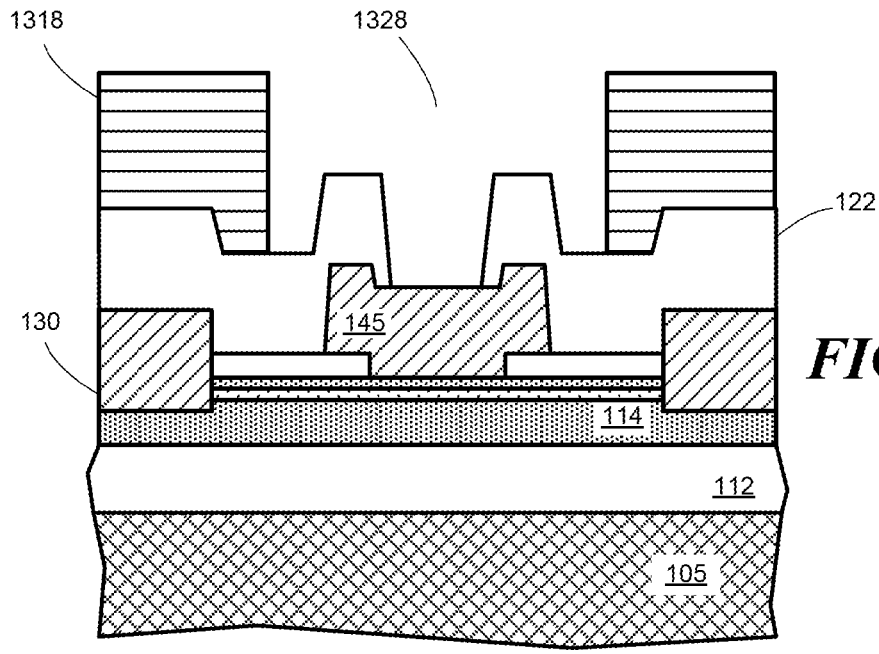
Figures 1K, 13:
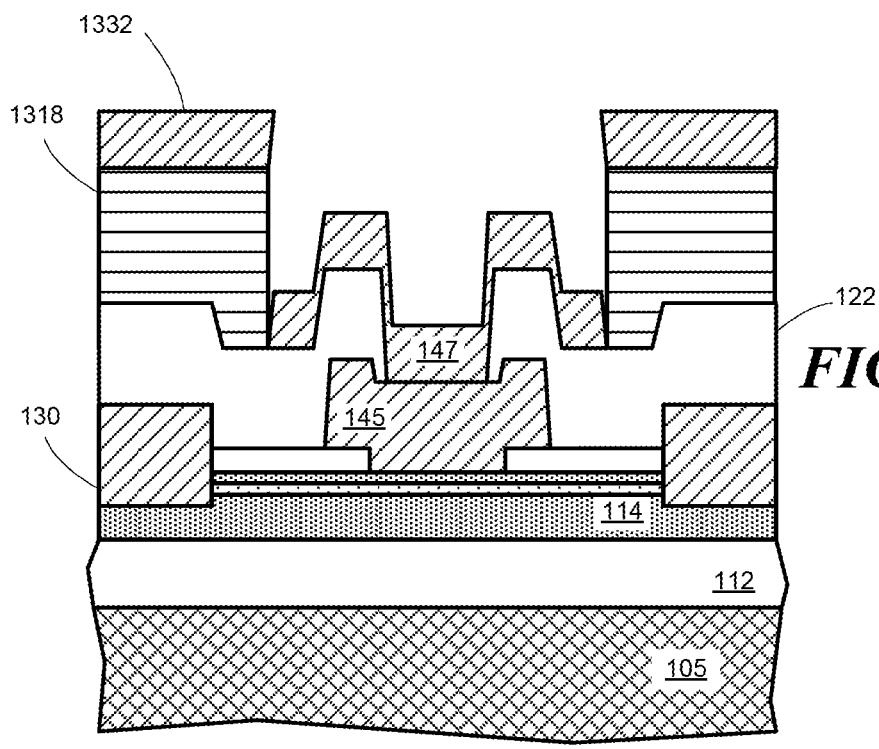

Subsequently, a second insulating layer 122 may be formed over the substrate. The second insulating layer may be deposited by any suitable deposition process. The second insulating layer may be coated with a fourth photoresist layer 1316, and also patterned to open a via over the first anode-connected field plate 145, as depicted in FIG. 13-1I. The second insulating layer 122 may be etched to expose a region of the first anode-connected field plate 145. The resist 1316 may be stripped, and a fifth layer of resist 1318 deposited and patterned to open a via for a second anode-connected field plate, as depicted in FIG. 13-1J. A suitable conductor for the second anode-connected field plate 147 may then be deposited as part of another liftoff process, for example, as illustrated in FIG. 13-1K. The fifth layer of resist 1318 and excess conductor 1332 may be removed from the wafer.

The processes of depositing an insulating layer and patterning an anode-connected field plate may be repeated to form one or more anode-connected field plates over the second anode-connected field plate.

Figures 2A, 13:
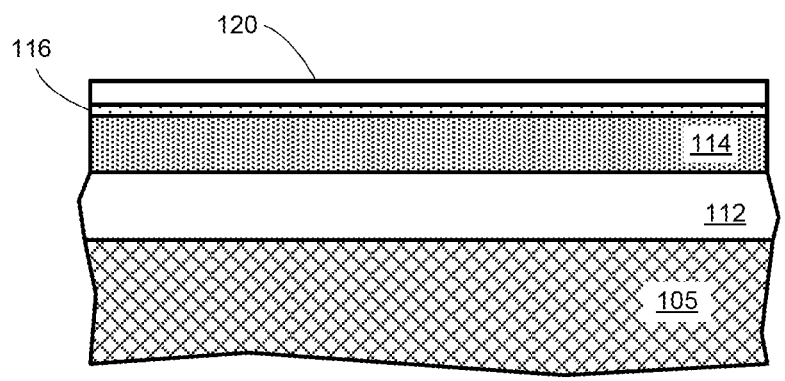
Figures 2B, 13:
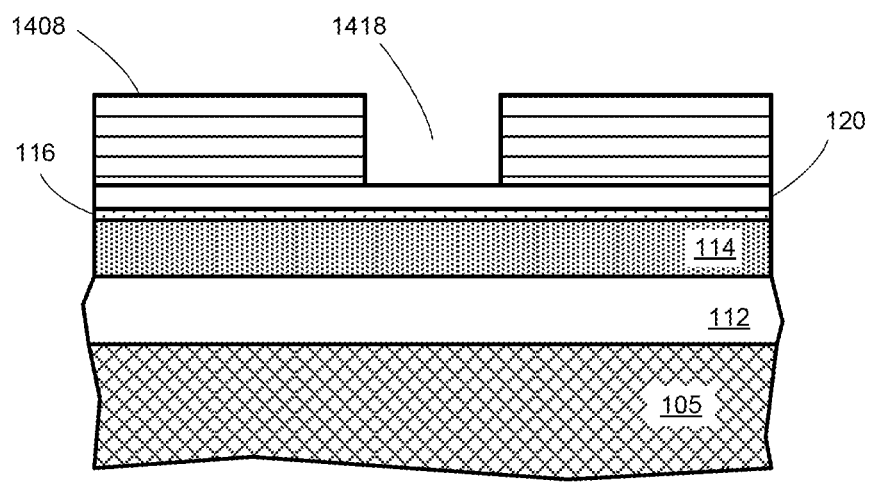
Figures 2C, 13:
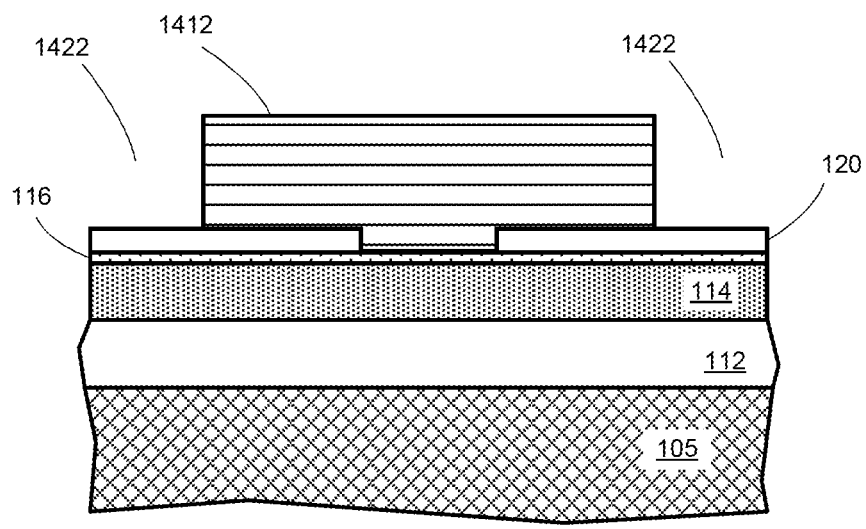

Other methods of fabricating a Schottky diode are possible. An alternative method is depicted, in part, in FIG. 13-2A through FIG. 13-2F. According to some embodiments, the wafer may comprise a bulk substrate 105, a buffer layer 112, a gallium-nitride conduction layer 114, a barrier layer 116, and an insulting layer 120. A photoresist 1408 may be patterned over the insulating layer 120, as depicted in FIG. 13-2B. The photoresist may be patterned to open an anode via 1418 by any suitable photolithography method, such as projection photolithography. Subsequently the insulating layer 120 may be etched anisotropically to expose a portion of the barrier layer 116 for subsequent deposition of the anode. The first resist layer 1408 may be stripped from the substrate, and a second layer of resist 1412 deposited and patterned to expose cathode vias 1422, as depicted in FIG. 13-2C.

Figures 2D, 13:
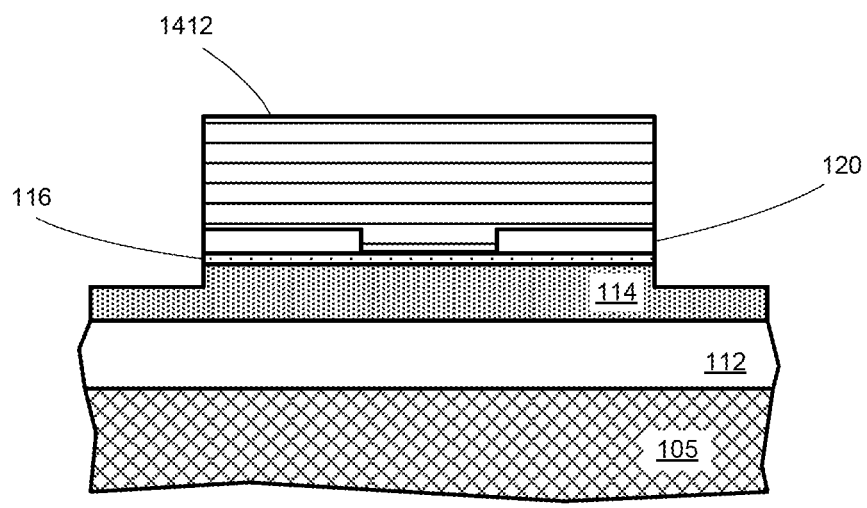

The insulating layer 120 at the cathode locations may then be etched anisotropically, as depicted in FIG. 13-2D to expose at least the barrier layer 116. In some embodiments, the etch may stop at or part way into the barrier layer. In some implementations, the etch may continue into the conduction layer 114, as depicted. The second resist layer 1412 may then be stripped from the substrate.

Figures 2E, 13:
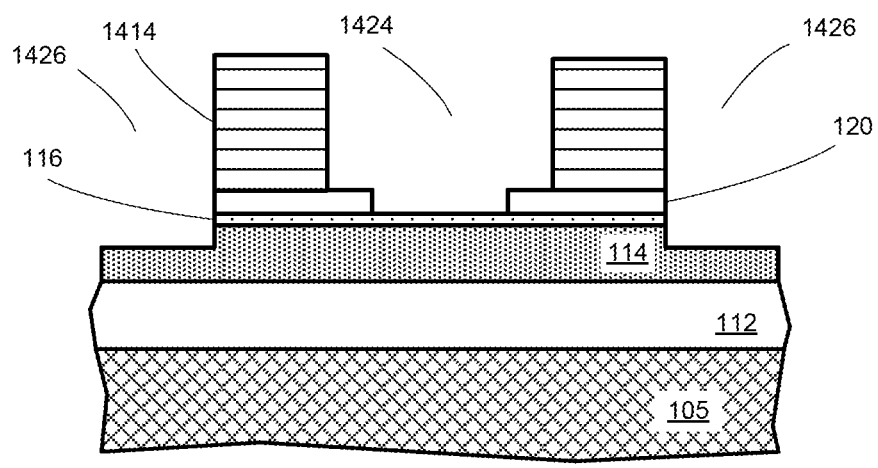
Figures 2F, 13:
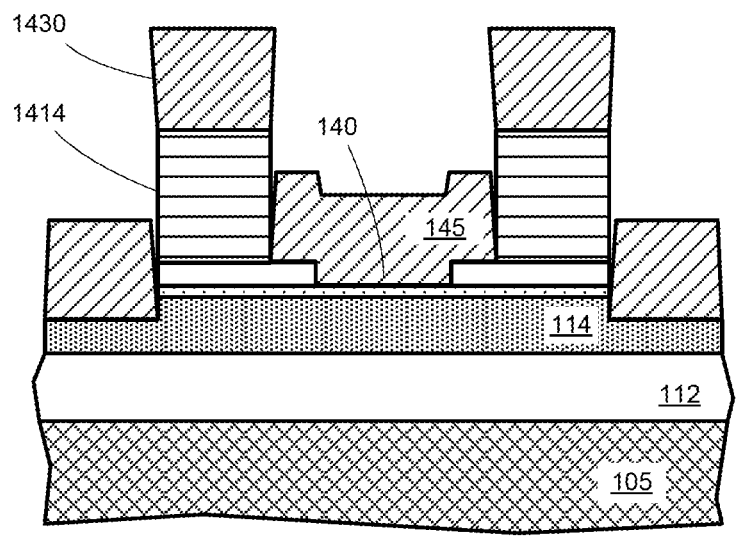

A liftoff process may then be carried out to deposit the anode and cathodes. For this process, a third resist layer 1414 may be pattered over the substrate to open up cathode vias 1426 and an anode via 1424, as depicted in FIG. 13-2E. The anode via 1424 may be larger than the opened area in the insulating layer 120 from the previous anode via patterning step. Anode and cathode depositions may then be performed in a single step, as illustrated in FIG. 13-2F. According to some embodiments, the deposition also forms an anode-connected field plate 145 that extends beyond the anode 140 over the insulating layer 120. The third resist layer 1414 and excess conductor 1430 may be removed from the wafer to yield a Schottky diode structure like that depicted in FIG. 13-1G. One or more additional anode-connected field plates may be formed over the first anode-connected field plate 145, as described in connection with FIG. 13-1H through FIG. 13-1K.

According to some embodiments, microfabrication techniques for forming anode-connected field plates may be performed without planarization of the substrate after depositions of the anode and first anode-connected field plate, insulating layers, and subsequent anode-connected field plates. Avoiding planarization steps can reduce the time and cost of device fabrication. In some cases, planarization steps (e.g., chemical-mechanical polishing) may be used after some or all depositions of the anode-connected field plates and insulating layers.

A figure of merit for a Schottky diode is an amount of leakage current that the device allows to flow under reverse-bias conditions. Ideally, a diode would allow no current to flow when reversed biased. However, diodes typically allow a small amount of leakage current to flow under reverse bias, and this leakage current can contribute to power loss or other deleterious effects in the device or in an instrument in which the diode is used.

Figure 14:
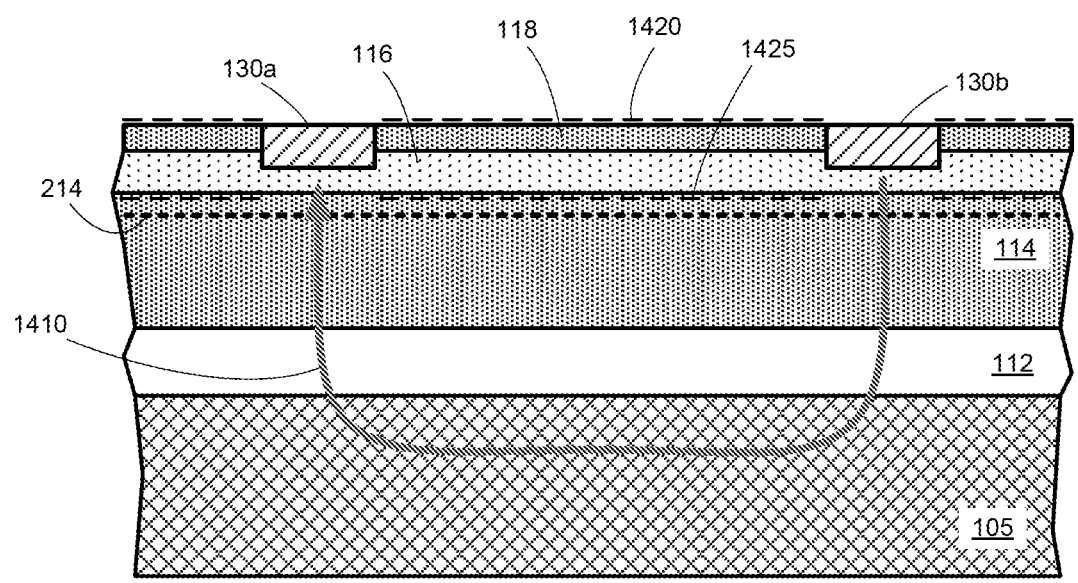
FIG. 14 depicts a semiconductor device structure and leakage current paths associated with a Schottky diode.

Leakage current in a semiconductor diode can be due to several different causes. Some of these causes are depicted in FIG. 14. In some cases, surface states 1420 and/or traps 1425 may provide pathways for leakage current. The traps may arise from interfacial defects that form at boundaries between different semiconductor layers. In some cases, leakage current may flow between ohmic contacts 130a, 130b via the two-dimensional electron gas (2DEG) 214, or via a parasitic channel that may form at a boundary between different semiconductor layers. In some devices, leakage current may flow vertically and laterally between ohmic contacts (e.g., along a path 1410 depicted in FIG. 14). For example, the leakage current may flow vertically from one ohmic contact 130b through one or more gallium-nitride layers and buffer layer to the substrate 105, flow laterally along the substrate, and then flow vertically to a second ohmic contact 130a. Ohmic contacts 130a and 130b may be ohmic contacts of different devices.

The inventors have studied leakage current in a test GaN Schottky diode device, and have found ways to significantly reduce leakage current in the device. In a first series of measurements that were carried out to better understand leakage-current characteristics, the test device was reverse biased while leakage-current density $J_r$ was measured. The test device comprised a Schottky diode having a structure like that shown in FIG. 1A. In the test device, the substrate was bulk silicon (Si), over which nucleation or buffer layers 112 comprising AlN were formed. An undoped GaN conduction layer 114 having a thickness of approximately 0.8 microns was epitaxially grown on the buffer layer, and an undoped barrier layer 116 of $Al_{0.27}Ga_{0.73}N$ was grown over the conduction layer. The thickness of the barrier layer was approximately 18 nm. An undoped GaN cap layer 118 having a thickness of approximately 2.5 nm was formed over the barrier layer 116. A silicon-nitride passivation layer 120 was then deposited over the cap layer prior to forming cathode 130 and anode 140 contacts. The cathode edges were spaced approximately one micron from the anode edges. A single anode-connected field plate was formed over the anode.

Figure 15:
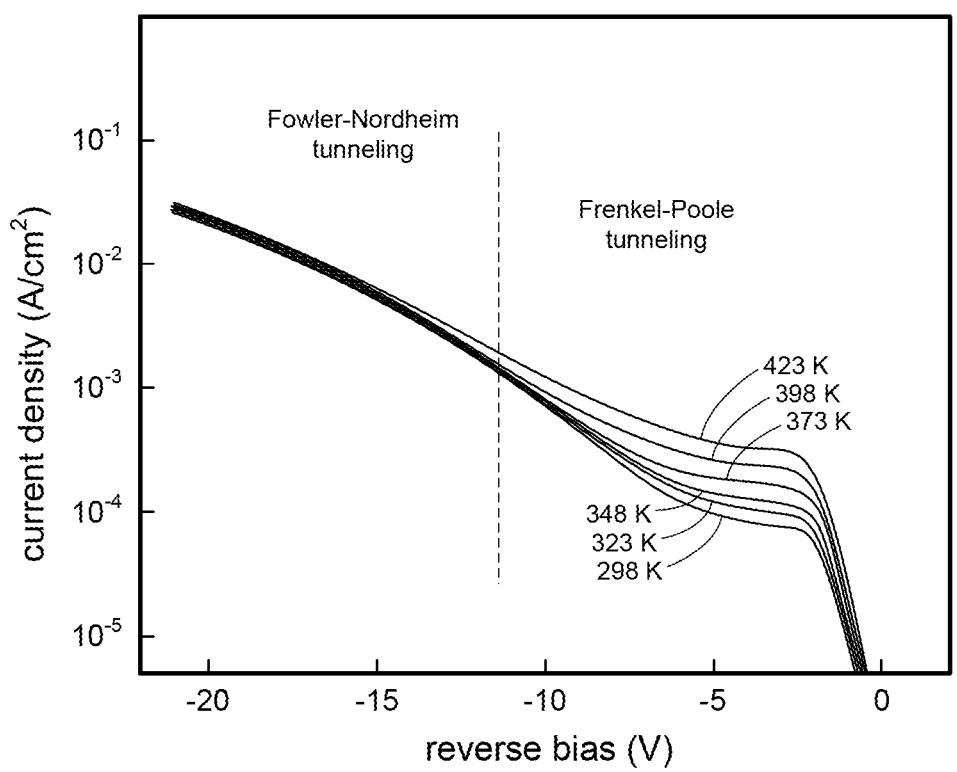
FIG. 15 illustrates leakage current characteristics for a test device structure.

Results from reverse-bias, leakage-current measurements are shown in FIG. 15. The applied bias was varied between about 0 volts and about −20 volts for six different device temperatures. The reverse-bias characteristics show that the leakage current in the test device is associated predominantly with Fowler-Nordheim tunneling and Frenkel-Poole tunneling. Under Fowler-Nordheim tunneling, the leakage current depends predominantly on applied bias and exhibits little dependence on device temperature. The onset of Fowler-Nordheim tunneling occurs for an applied bias of about −12 volts for the test device. Under Frenkel-Poole tunneling, the leakage current exhibits temperature dependence, and is the predominant form of leakage current for bias values between about −2 volts and about −12 volts. The inventors found that the leakage current results agree well with Fowler-Nordheim and Frenkel-Poole theories.

Different approaches for reducing leakage current were tried. In some devices, mesas were formed to help isolate ohmic contacts. For example, trenches were etched around ohmic contacts in non-active regions to reduce unwanted current flow via surface and trapping states and the 2DEG between ohmic contacts (e.g., between contacts of adjacent devices or other device contacts). The inventors found that mesa formation did not reduce leakage-current flow, and in some cases increased leakage-current flow. The increase in leakage current was believed to be due to the generation of more defect states and surface states from the etching.

Figure 16A:
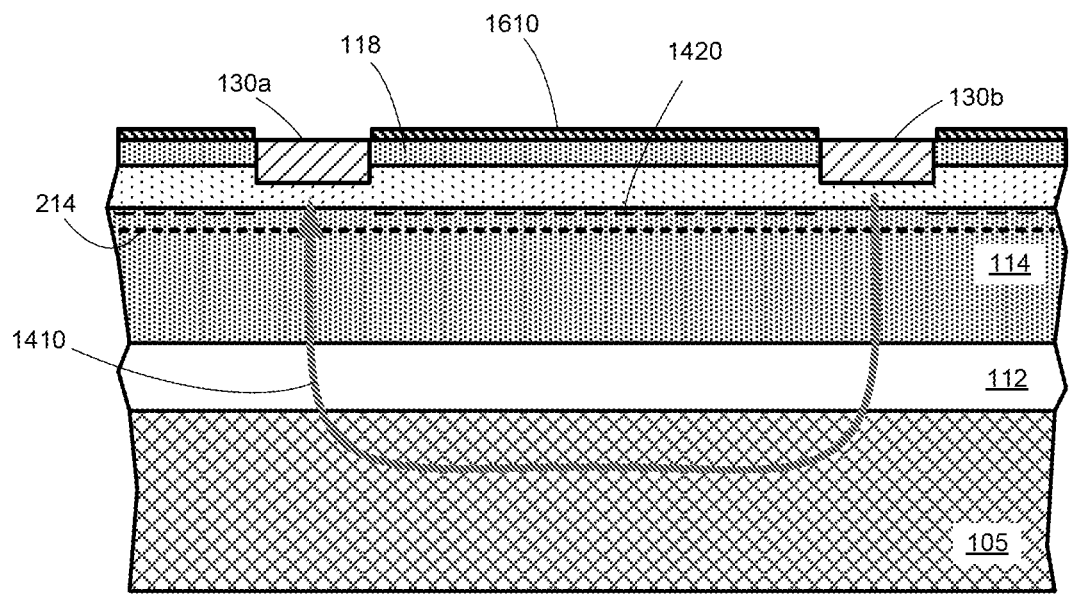
FIG. 16A depicts passivation of surface states, according to some embodiments.
Figure 16B:
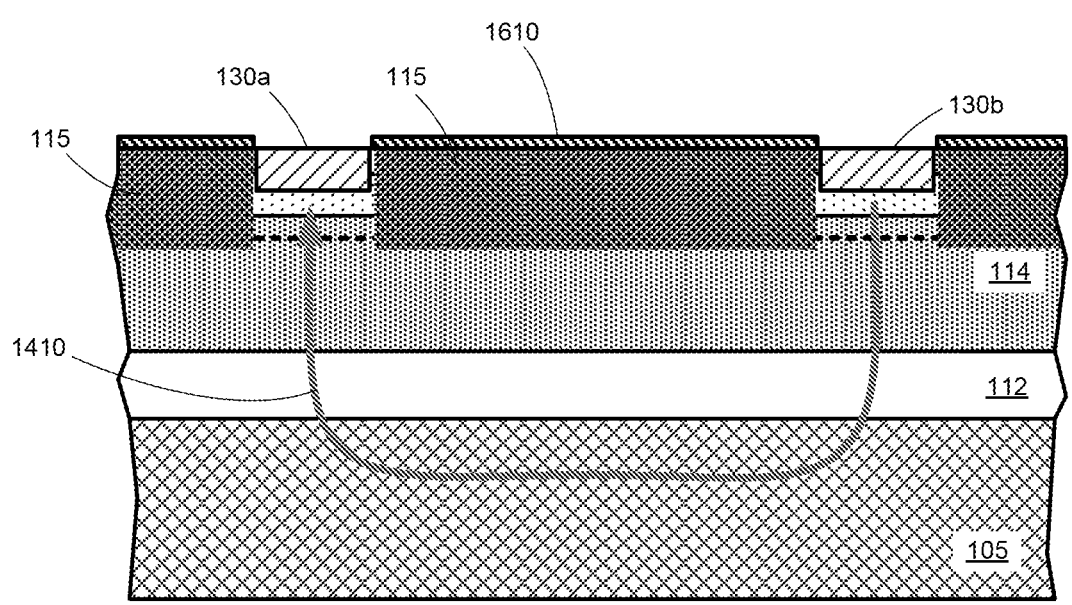
FIG. 16B depicts formation of isolation regions by ion implantation, according to some embodiments.

In some devices, a silicon-nitride passivation layer 1610 may be formed in regions around ohmic contacts 130a, 130b, as depicted in FIG. 16A. The passivation layer can passivate the surface states 1420 and appreciably reduce a component of leakage current due to surface-state currents. In some devices, ion implantation can be used in non-active regions of the device alternatively, or in addition to, a passivation layer 1610. The ion implantation may form electrical isolation regions 115 within the semiconductor layers, as depicted in FIG. 16B. The ion implantation can damage the crystalline structure, and thereby increase its resistance to leakage current flow.

Several ion species (boron, nitrogen, and phosphorus) were implanted in test devices to determine their effect on leakage current. The inventors found that implanted nitrogen provided the largest reduction in leakage current among the different ion species. Additionally, a larger reduction in leakage current can be obtained when the nitrogen is implanted at a plurality of different energies, so as to extend the damage well into the conduction layer 114. According to some embodiments, nitrogen may be implanted at two or more different energies so that the nitrogen implants to depths between about 0.2 microns and about 0.5 microns below the top surface of the cap layer 118, or below the top surface of the barrier layer 116 if a cap layer is not used.

Figure 17:
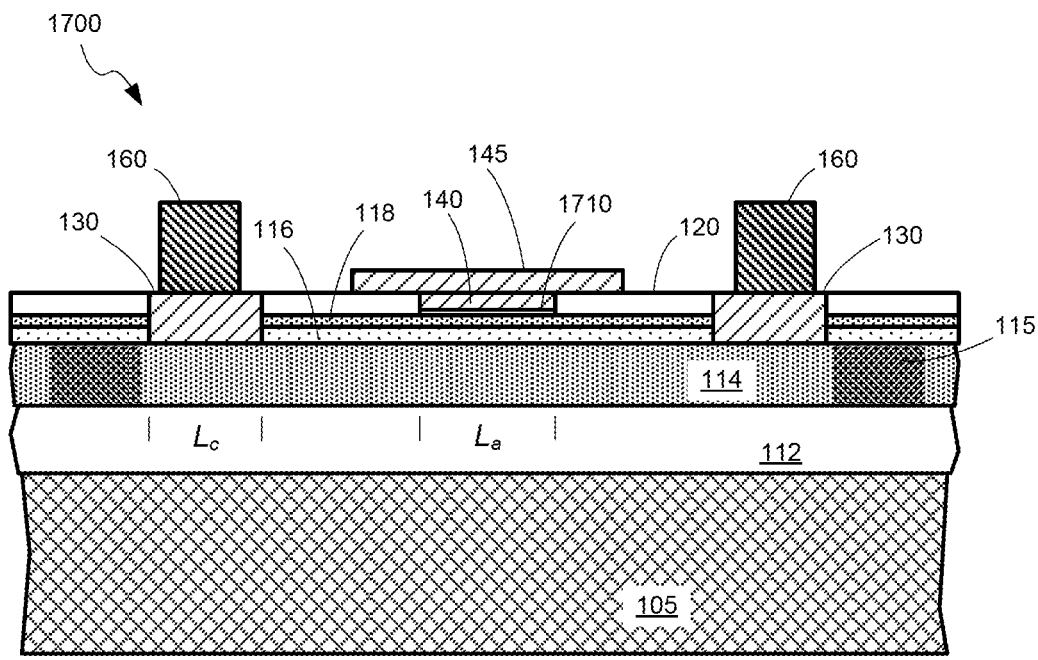
FIG. 17 depicts an elevation view of structure of a lateral, high-voltage Schottky diode comprising gallium-nitride material, according to some embodiments.

Although surface passivation and ion implantation provided useful reductions in reverse-bias leakage current, the inventors surprisingly found that the largest reduction in leakage current is obtained when a pre-treatment process is used prior to deposition of the anode 140. In conventional anode patterning and referring to FIG. 13-1E, the passivation layer 120 may be etched to expose the underlying barrier layer 116 or cap layer 118 for the anode contact. The anode may then be deposited in electrical contact with the exposed gallium nitride or AlGaN layer, as depicted in FIG. 13-1F. The inventors have found that prior to depositing the anode, subjecting the exposed layer to an oxygen plasma can significantly reduce reverse-bias leakage current in a gallium-nitride Schottky diode. In some embodiments, the exposed cap or barrier layer is subjected to an $O_2$ plasma having a pressure between about 0.5 Torr and about 3 Torr, and an applied power between about 0.3 kW and about 2 kW. The treatment time may be between about 10 sec and about 2 minutes, according to some embodiments. In some embodiments, the pressure is about 1.5 Torr with a power of about 1.0 kW for a duration of about 30 sec. Referring to the Schottky diode 1700 in FIG. 17, the $O_2$ plasma treatment is believed to form a thin gallium-oxide layer 1710 under the subsequently deposited anode 140. The gallium-oxide layer may be between about 10 Angstroms and about 50 Angstroms-thick. This thin oxide layer does not appreciably affect forward current flow, but significantly reduces reverse-bias leakage current.

In some cases, other gases may be included in the $O_2$ plasma treatment to help passivate the exposed surface. Other gases may include, but are not limited to nitrogen, hydrogen, argon, and forming gas (a mixture of hydrogen and nitrogen having about 5% hydrogen).

Figure 18:
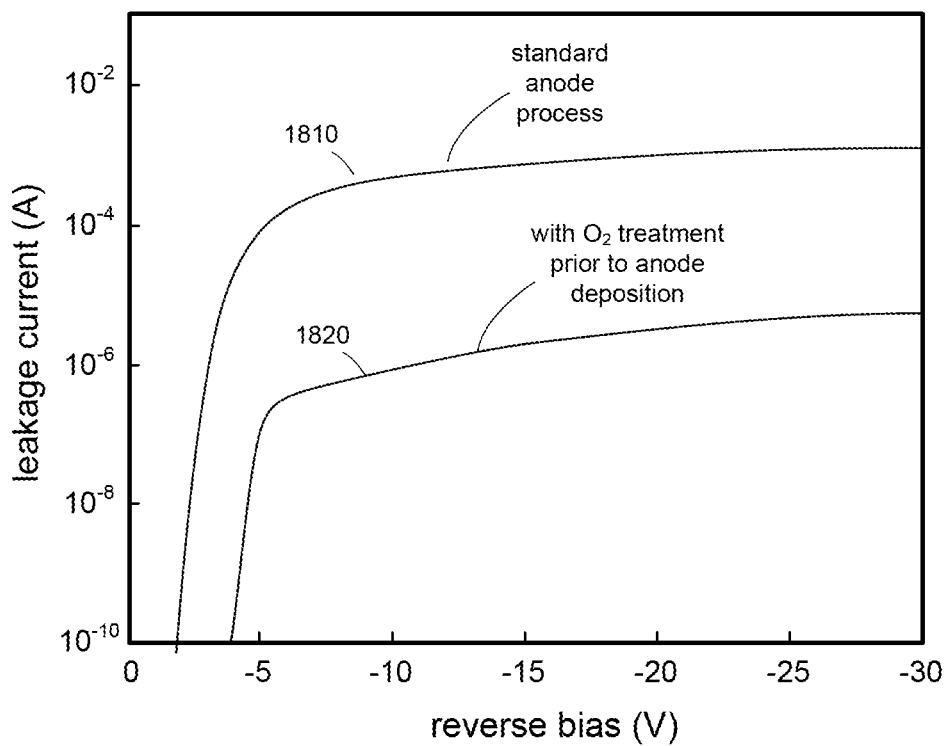
FIG. 18 depicts a reduction in leakage current due to oxygen plasma treatment of a gallium-nitride surface prior to forming an anode, according to some embodiments.

A measured reduction in reverse-bias leakage current due to $O_2$ plasma pre-treatment is shown in FIG. 18. Over sixty devices were tested, for which conventional techniques were used to open the nitride passivation layer and form the anode. An exemplary leakage-current curve for these devices is plotted as the upper trace 1810 in the graph. Over sixty similar devices were also tested, but for these devices an $O_2$ plasma pre-treatment was used prior to depositing the anode. An exemplary leakage-current curve for these devices is plotted as the lower trace 1820 in the graph. The reduction in leakage current due to the $O_2$ pre-treatment was approximately a factor of 100.

Figure 19:
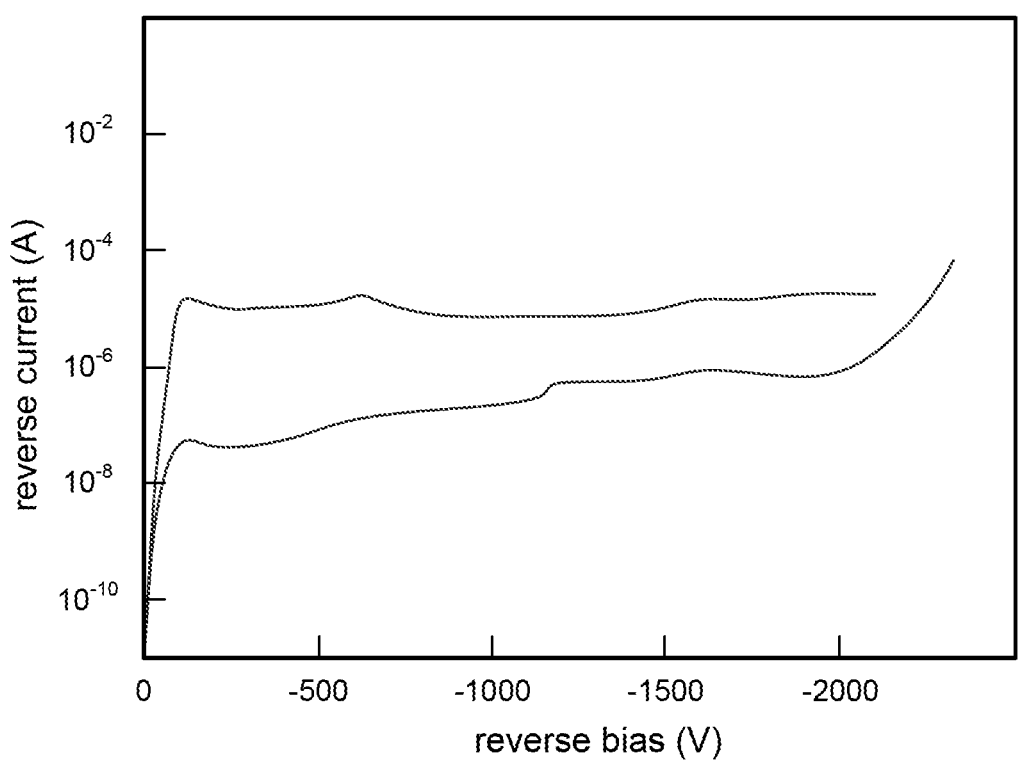
FIG. 19 shows measured reverse-bias characteristics of exemplary Schottky diodes fabricated according to the present embodiments.

Schottky diodes have been fabricated by the inventors having multiple anode-connected field plates, electrical isolation regions and passivation layers around ohmic contacts in non-active areas, and using an $O_2$ plasma treatment of the cap layer or barrier layer prior to depositing the anodes. Exemplary reverse-bias current curves are shown in FIG. 19 for two typical devices fabricated on different wafers. Four Schottky diodes were tested from each wafer, and produced similar curves. These diodes are capable of withstanding reverse biases of up to about 2100 volts. The reverse-bias leakage currents are between approximately 0.1 microamps and approximately 10 microamps over this range of reverse bias voltages. The diodes had anode and cathode widths of approximately 250 microns, so the reverse leakage current values correspond to about 0.4 µA/mm and about 40 µA/mm of anode width $W_a$. The difference in value of reverse-bias current for the two curves is believed to be due to differences in oxide thickness formed by the $O_2$ plasma treatment for the different wafers. The reverse bias tests were carried out by applying DC voltages. The diodes were capable of withstanding such high reverse-bias voltages for extended periods of time (greater than one second).

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention.

Accordingly, the foregoing description is by way of example only and is not intended as limiting. The invention is limited only as defined in the following claims and the equivalents thereto.

The invention claimed is:

1. A Schottky diode comprising:
   a conduction layer;
   a first layer comprising a first semiconductor material over the conduction layer;
   a second layer comprising a second semiconductor material over the first layer, the first semiconductor material being different than the second semiconductor material;
   a first cathode and a second cathode, spaced apart and in electrical contact with the conduction layer, the first cathode and the second cathode being electrically connected to each other as a cathode of the Schottky diode; and
   an anode over the second layer between the first cathode and the second cathode.

2. The Schottky diode of claim 1, wherein the conduction layer comprises gallium-nitride material.

3. The Schottky diode of claim 1, further comprising an oxide layer between the anode and the second layer, the oxide layer extending under a center of the anode.

4. The Schottky diode of claim 3, wherein the oxide layer comprises a gallium-oxide layer.

5. The Schottky diode of claim 1, further comprising an anode-connected field plate electrically connected to the anode and extending on beyond outer edges of the anode toward the first cathode and the second cathode.

6. The Schottky diode of claim 5, wherein the anode-connected field comprises a multilayer composition selected from the following group: Ti/Pt/Au, Al/Cu, or TiN/Cu.

7. The Schottky diode of claim 5, further comprising a second anode-connected field plate electrically connected to the anode-connected field plate at a central region of the anode-connected field plate, the second anode-connected field plate extending on beyond outer edges of the anode-connected field plate toward the first cathode and the second cathode.

8. The Schottky diode of claim 7, further comprising an insulating layer positioned in part between the anode-connected field plate and the second anode-connected field plate, the insulating layer contacting a peripheral region of a top surface of the anode-connected field plate, outside of the central region.

9. The Schottky diode of claim 1, wherein the anode comprises a multilayer composition selected from the following group: Ni/Pd/Au/Ti, Ni/Pt/Au/Ti, Ni/Ti/Al/W, Ni/W/Al/W, W/Al/W, Ni/Wn/Al/W, WN/Al/W, and Pt/Au/Ti.

10. The Schottky diode of claim 1, further comprising a buffer layer on a substrate and under the conduction layer.

11. The Schottky diode of claim 10, wherein the substrate comprises silicon.

12. The Schottky diode of claim 1, wherein the first layer comprises aluminum gallium nitride.

13. The Schottky diode of claim 12, wherein the second layer comprises gallium-nitride material.

14. The Schottky diode of claim 1, further comprising electrical isolation regions in the conduction layer, outside the Schottky diode.

15. The Schottky diode of claim 14, wherein the electrical isolation regions comprise damaged crystal lattice structure in the conduction layer.

16. The Schottky diode of claim 14, wherein the electrical isolation regions comprise one or more of the following implanted ion species: nitrogen, phosphorous, boron, and argon.

17. The Schottky diode of claim 1, wherein the first cathode and the second cathode extend parallel to each other in electrical contact with the conduction layer.

18. The Schottky diode of claim 1, further comprising:
    a third cathode in electrical contact with the conduction layer, spaced apart from the second cathode, and extending parallel to the second cathode; and
    a second anode over the second layer between the second cathode and the third cathode.

19. The Schottky diode of claim 18, further comprising:
    a cathode conductive lead electrically connected to the first cathode, the second cathode, and the third cathode; and
    an anode conductive lead electrically connected to the anode and the second anode.

20. The Schottky diode of claim 18, further comprising:
    a first bond pad electrically connected to the cathode conductive lead; and
    a second bond pad electrically connected to the anode conductive lead.

21. A method for forming a Schottky diode, the method comprising:
    forming a conduction layer on a substrate;
    forming a first layer of a first semiconductor material over the conduction layer;
    forming a second layer of a second semiconductor material over the first layer, the first semiconductor material being different than the second semiconductor material;
    forming a first cathode and a second cathode spaced apart and in electrical contact with the conduction layer, the first cathode and the second cathode being electrically connected to each other as a cathode of the Schottky diode; and
    forming an anode over the second layer between the first cathode and the second cathode.

22. The method of claim 21, further comprising forming an oxide layer between the anode and the second layer such that the oxide layer extends under a center of the anode.

23. The method of claim 22, wherein forming the oxide layer comprises:
    opening a via in the oxide layer to expose a region of the conduction layer for the anode, prior to forming the anode; and
    subjecting the region to an oxygen plasma for a period of time.

24. The method of claim 23, wherein the period of time is between 10 seconds and approximately 120 seconds.

25. The method of claim 23, further comprising maintaining pressure between approximately 0.5 Torr and approximately 3 Torr while subjecting the region to the oxygen plasma.

26. The method of claim 21, further comprising forming one or more anode-connected field plates in electrical contact with the anode, the one or more anode-connected field plates extending beyond outer edges of the anode.

* * * * *